(12) United States Patent
Zagoskin

(10) Patent No.: US 6,459,097 B1
(45) Date of Patent: Oct. 1, 2002

(54) QUBIT USING A JOSEPHSON JUNCTION BETWEEN S-WAVE AND D-WAVE SUPERCONDUCTORS

(75) Inventor: Alexandre M. Zagoskin, Vancouver (CA)

(73) Assignee: D-Wave Systems Inc., Vancouver (CA)

( * ) Notice: Subject to any disclaimer, the term of this patent is extended or adjusted under 35 U.S.C. 154(b) by 0 days.

(21) Appl. No.: 09/479,336

(22) Filed: Jan. 7, 2000

(51) Int. Cl.$^7$ ................................................. H01L 39/22
(52) U.S. Cl. .......................... 257/31; 505/170; 505/190
(58) Field of Search ................................ 438/795, 909, 438/910, 162; 257/30, 34, 31; 505/170, 190, 230, 234

(56) References Cited

U.S. PATENT DOCUMENTS

| | | | |
|---|---|---|---|
| 3,953,749 A | | 12/1974 | Baechtold et al. ........... 307/207 |
| 5,157,466 A | | 3/1991 | Char et al. ...................... 357/5 |
| 5,560,836 A | * | 10/1996 | Nagaishi ........................ 216/3 |
| 5,917,322 A | | 10/1996 | Gershenfeld et al. ....... 324/307 |
| 5,571,778 A | * | 11/1996 | Fujimono et al. ........... 505/329 |
| 5,883,051 A | * | 3/1999 | Ishimaru et al. ............ 505/190 |
| 6,016,433 A | * | 1/2000 | Mizuno et al. .............. 505/190 |

OTHER PUBLICATIONS

Ioffe, L. B. et al.: "Environmentally decoupled sds–wave Josephson junctions for quantum computing" Nature, vol. 398, No. 6729, Apr. 22, 1999, pp. 679–681, XP002168889, ISSN: 0028–0836.

Smilde, H. J. H. et al.: "Realization and properties of ramp–type $Yba_2Cu_3O_{7-\delta}$/Au/Nb Junctions" 6$^{th}$ Twente Workshop on Superconductivity: New Devices and circuits, Enschede, Netherlands, Apr. 16–19, 2000, vol. 350, No. 3–4, pp. 269–275, XP002168891, Physica C, Feb. 15, 2001, Elsevier, Netherlands, ISSN: 0921–4534.

Zagoskin, A. M. et al: "A scalable, tunable qubit, based on a clean DND or grain boundary D–D junction" Los Alamos Preprint Archive, 'Online! Mar. 10, 1999, XP002168890, Retrieved from the Internet: <URL:http://xxx.lanl.gov/abs/cond–mat/9903170>.

(List continued on next page.)

Primary Examiner—David Nelms
Assistant Examiner—Dung A Le
(74) Attorney, Agent, or Firm—Skjerven Morrill LLP; Norman R. Klivans; Gary J. Edwards

(57) ABSTRACT

A solid-state quantum computing structure includes a set of islands that Josephson junctions separate from a first superconducting bank. A d-wave superconductor is on one side of the Josephson junctions (either the islands' side or the bank's side), and an s-wave superconductor forms the other side of the Josephson junctions. The d-wave superconductor causes the ground state for the supercurrent at each junction to be doubly degenerate, with two supercurrent ground states having distinct magnetic moments. These quantum states of the supercurrents at the junctions create qubits for quantum computing. The quantum states can be uniformly initialized from the bank, and the crystal orientations of the islands relative to the bank influence the initial quantum state and tunneling probabilities between the ground states. A second bank, which a Josephson junction separates from the first bank, can be coupled to the islands through single electron transistors for selectably initializing one or more of the supercurrents in a different quantum state. Single electron transistors can also be between the islands to control entanglements while the quantum states evolve. After the quantum states have evolved to complete a calculation, grounding the islands, for example, through yet another set of single electron transistors, fixes the junctions in states having definite magnetic moments and facilitates measurement of the supercurrent when determining a result of the quantum computing.

25 Claims, 6 Drawing Sheets

OTHER PUBLICATIONS

D. Agterberg, and M. Sigrist, "Asymmetric magnetic interference patterns in 0–n Josephson junctions", LANL cond–mat/9711157 (Nov. 17, 1997).

L. Alff, H. Takashima, S. Kashiwaya, N. Terada, T. Ito, K. Oka, Y. Tanaka, and M. Kayanagi, "Orientation Dependence of Tunneling Spectra in YBCO and NCCO", Materials and Mechanisms of *Superconductivity, High temperature Superconductors 5 (Feb/Mar. 1997)*.

N. Allsopp, J. Sanchez Canizares, R. Raimondi, and C. Lambert, "Giant Conductance Oscillations In Mesoscopic Andreev Interferometers", LANL cond–mat/9504113 (Apr. 1995).

A. Altland, B. Simons, and D. Taras–Semchuk, "Field theory of mesoscopic fluctuations in superconductor/normal–metal systems", JETP Lett., 67, 22 (Jan. 1998) [Hard Copy].

N. Argaman, "Non–equilibrium Josephson–like effects in mesoscopic S–N–S junctions", LANL cond–mat/9709001 (Aug. 29, 1997).

P. Bagwell, "Suppression of the Josephson current through a narrow, mesoscopic, semiconductor channel by a single impurity", Phys. Rev. B, 46:19, 12573–12586 (Nov. 15, 1992).

Y. Barash, A. Galaktionov, and A. Zaikin, "Charge transport in junctions between d–wave superconductors", Phys. Rev. B, 52:1, 665–682 (Jul. 1, 1995).

Y. Barash, H. Burkhardt, and D. Rainer, "Low–Temperature Anomaly in the Josephson Critical Current of Junctions in d–Wave Superconductors", Phys. Rev. Lett., 77:19, 4070–4073 (Nov. 4, F1996).

J. Bardeen, and J. Johnson, "Josephson Current Flow in Pure Superconducting–Normal–Superconducting Junctions", Phys. Rev. B, 5:1, 72–78 ( Jan. 1, 1972).

A. Barone and G. Paterno, "Physics and Applications of the Josephson Effect", John Wiley & Sons, New York, (1982) [Hard Copy Chapter 1 Only].

V. Barzykin, and A. Zagoskin, "Coherent transport and nonlocality in mesoscopic SNS junctions: anomalous magnetic interference patterns", LANL cond–mat/9805104 (Nov. 16, 1998).

Alexandre Zagoskin and Alexandre Blais, "Operation of universal gates in a solid state quantum computer based on clean Josephson junctions between d–wave superconductors"LANL quant–ph/9905043 (Apr. 7, 2000).

V. Barzykin, and A. Zagoskin, "Nonlocality and anomolous critical current dependence on the magnetic flux in mesoscopic SNS junctions", LANL cond–mat/9805104 (May 1998).

C. Beenakker, J.A. Melsen, and P.W. Brouwer, "Giant backscattering in angle–resolved Andreev reflection", LANL cnod–mat/9501003 (Jan. 3, 1995).

M. Blaauboer, R. Koperdraad, A. Lodder, and D. Lenstra, "Size–effects in the Density of States in NS and DND junctions", LANL cond–mat/9605078 (May 13, 1996).

G. Blatter, V. Geshkenbein, L. Ioffe, "Engineering Superconducting Phase Qubits", cond–mat/9912163 (Dec. 9, 1999).

M. Bocko, A. Herr and M. Feldman, "Prospect for Quantum Coherent Computation Using Superconducting Electronics", IEEE Trans. App. Sup. 7, 3638 (1997).

K. Bottcher, and T. Kopp, "Multichannel do Josephson effect in ballistic point contacts", Phys. Rev. B., 55:17, 11670–11687 (May 1, 1997).

P. Carruthers, and M. Nieto, "Phase ans Angle Variables in Quatnum Mechanics", Rev. Mod. Phys., 40, 411–440 (April 1968).

H. De Raedt, K. Michielsen, and T. Klapwijk, "Andreev reflection in nanoscale metal–superconductor devices", Phys. Rev. B, 50:1, 631–634 (Jul. 1, 1994).

D. Deutsch, "Quantum Theory as a Universal Physical Theory", Inat. J. Theor. Phys. 24.1, 1–41 (1985).

T. Devereaux, and P. Fulde, "Multiple Andreev scattering in superconductor–normal metal–superconductor junctions as a test for anisotropic electron pairing", Phys. Rev. B, 47:21, 14638–14641 (Jun. 1, 1993).

D. P. DiVincenzo, and D. Loss, "Quantum Computers and Quantum Coherence", LANL preprint cond–mat/9901137 (1999).

D. Feder, A. Beardsall, A. Berlinsky, and C. Kallin, "Twin boundaries in d–wave superconductors", Phys. Rev. B, 56:10, R5751–R5754 (Sep. 1, 1997).

R. Feynman, "Simulating Physics with Computers", Int. Journal of Theoretical Phys., 21:6/7, 467–488 (1982).

M. Fogelstrom, S. Yip, and J. Kurkijarvi, "Pinhole junctions in d–wave superconductors", LANL cond–mat/9709120 (Sep. 10, 1997).

G. Goppert, X. Wang, and H. Grabert, "High Temperature anomaly of the conductance of a tunnel junction", Phys. Rev. B, 55:16, R10213–R10216 (Apr. 15, 1997).

M. Geller, "Current–carrying ground states in mesoscopic and macroscopic systems", Phys. Rev. B., 53:15, 9550–9553 (Apr. 15, 1996).

V. Geshkenbein, A. Larkin, and A. Barone, "Vortices with half magnetic flux quanta in "heavy–fermion" superconductors", Phys. Rev. B, 36:1, 235–238 (Jul. 1, 1987).

A. Golubov and M. Yu. Kupriyanov "Anamalous proximity effect in d–wave superconductors", LANL preprint cond–mat/9803369 (1998).

A. Golubov and M. Yu. Kupritanov, "Surface electronic scattering in d–wave superconductors", LANL preprint cond–mat/9901318 (1999).

H. Grabert, and G, Ingold, "Mesoscopic Josephson effect", Superlattices and Microstructures, 25:5/6, 915 (1999).

G. Hackenbroich, B. Rosenow, and H. Weidenmeuller, "Quantum Zeno effect and parametric resonance in mesoscopic physics", LANL cond–mat/9807317 (Jul. 1998).

M. Hurd, T. Lofwander, G. Johansson, and G. Wendin, "ac Josephson effect in d–wave junctions", Phys. Rev. B, 59:6, 4412–4426 (Feb. 1, 1999).

I. Iguchi and Z. Wen, "Experimental evidence for a d–wave pairing state in YbaCuO from a study of YbaCuO/insulator/Pb Josephson tunnel junctions", Physical Rev. B, 49:17, 12388:12391 (May 1, F1994).

E. Il'ichev, V. Zakosarenko et al., "Nonsinusoidal Current–Phase Relationship of Grain Boundary Josephson Junctions in High–Tc Superconductors", Phys. Rev. Lett., 81:4, 894–897 (Jul. 27, 1998).

E. Il'ichev et al., "Temperature dependence of the current–phase relation for YBaCuO step–edge Josephson Junctions", App. P. Lett., 72:6, 731–733 (Feb. 9, 1998).

L. Ioffe, V. Geshkenbein, M. Feigel'man, A. Fauchere, and G. Blatter, "Quiet SDS'Josephson Junctions for Quantum Computing", LANL cond–mat/9809116 (Jan. 11, 1999).

P. Joyez et al., "Observation of Parity–Induced Suppression of Josephson Tunneling in the Superconducting Single Electron Transistor", Physical Review Letters, vol. 72:15, 2458–2461 (Apr. 11, 1994).

A. Kadigrobov, A. Zagoskin et al., "Giant conductance oscillations controlled by supercurrent flow through a ballistic masoscopic conductor", Phys. Rev. B, 52:12, R8662–R8665–(Dec. 15, 1995).

A. Kadigrobov, A. Zagoskin, R. Shekhter, and M. Jonson, "Giant Conductance Oscillations in an Normal Mesoscopic Ring Induced by an SNS Josephson Current", LANL cond–mat/9410080 (Oct. 21, 1994).

C. L. Kane, and Mathew P. A. Fisher, "Transmission through barriers and resonant tunneling in an interacting one–dimensional electron gas", Phys. Rev. B, 46:23, 15233–15262 (Dec. 15, 1992).

S. Kashiwaya, L. Alff, et al., "Tunneling spectroscopy and symmetries in YBCO and NCCO", [preprint; date unknown; hard copy].

S. Kashiwaya, Y. Tanaka, M. Koyanagi, S. Ueno, and K. Kajimura, "Quasiparticle tunneling in d/I/d junctions", Materials and Mechanisms of Superconductivity, High temperature Superconductors 5 (1997).

J. R. Kirtley, K. Moler, and D. Scalapino, "Spontaneous Flux and Magnetic Interference Patterns in 0–n Josephson Junctions", LANL cond–mat/9703067 (Mar. 6, 1997).

A. Yu. Kutaev, "Quantum measurements and the Abelian Stabilizer Problem", LANL quart–ph/9511026 (Nov. 20, 1995).

T. Klapwijk, "Mesoscopic superconductor–semiconductor heterostructures", Physica B, 197, 481–499 (1994).

E. Knill, R. Laflamme, and W. Zurek, Science, "Resilient Quantum Computation", Science, 279, 342, (Jan. 16, 1998).

P. V. Komissinski, E. Il'ichev, et al., "Observations of Second Harmonic in Superconducting Current–Phase relation of Nb/Au/(001) YBaCuO hetrojunctions", LANL peprint cond–mat/0106559 (Jun. 27, 2001).

K. Kouznetsov, A. Sun, et al. "C–axis Josephson Tunneling Between YBaCuO & Pb: Direct Evidence for Mixed Order Parameter Symmetry in a High–T Semiconductor" LALN cond–mat/9705283 (May 27, 1997).

I. Kulik, and R. Shekhter, "Kinetic phenomena and charge discreteness effects in granulated media", Sov. Phys.–JETP, 41, 308 (Feb. 1975).

I. Kulik, and Y. Mitsai, "Effect of impurities on the Josephson current through SNS through SNS junctions", Sov. J. Low Temp. Phys., 1:7, 434 (Jul. 1975).

G. Lesovik, T. Martin, and J. Torres, "Josephson Frequency Singularity in the Noise of Normal Metal–Superconductor Junctions", LANL cond–mat/9902278 (Jun. 25, 1999).

Li–Fu Chang, and Bagwell, "Ballistic Josephson–current flow through an asymmetric superconductor–normal–metal–superconductor junction", Phys. Rev. B., 49:22, 15853–15863 (Jun. 1, 1994).

L. B. Ioffe, G. Blatter et al. "Quiet SDS Josephson Junctions for Quantum Computing", LANL preprint cond–mat/9809116 (1998).

T. Lofwander, G. Johansson, M. Hurd, G. Wendin, "Semiconducting d–wave junctions: The disappearance of the odd ac components", LANL preprint cond–mat/971004 (1997).

Y. Makhlin, G. Schoen, and A. Schnirman, "Quantum computing & Josephson Junctions Circuits", pg. 439 in Quantum Mesoscopic Phenomena & Mesoscopic Devices in Microelectronics, Kluwer, Dordrecht, The Netherlands (2000).

Y. Makhlin, G. Shoen, and A. Shnirman, "Josephson junction qubits with controlled couplings", LANL cond–mat/9808067 (Aug. 6, 1998).

D. Maslov, and P. Goldbart, "Quasi–Andreev reflection in inhomogenoeus Luttinger liquids", LANL cond–mat/9711070 (Nov. 7, 1997).

D. Maslov, M. Stone, P. Goldbart, and D. Loss, "Josephson current and proximity effect in Luttinger liquids", Phys. Rev. B, 53:3, 1548–1557 (Jan. 15, 1996).

Mooji et al., "Josephson persistant–curent Qubit", Science, 285, 1036–1039, (Aug. 13, 1999).

A. F. Morpurgo, B.J. van Wees et al., "Energy Spectroscopy of Andreev Levels between Two Superconductors", Phys. Rev. Lett., 79:20, 4010–4013 (Nov. 17, 1997).

M. Nieto, "Quantized Phase Effect and Josephson Tunneling", Phys. Rev., 167:2, 416–417 (Mar. 10, 1968).

M. Oshikawa, and A. Zagoskin, "Voltage fluctuations on a superconductor grain attached to a quantum wire", LANL cond–mat/9810303 (Jan. 1999).

S. Ostlund, "Landau Ginzburg theory of the d–wave Josephson junction", Phys. Rev. B, 58:22, R14757–R14758 (Dec. 1, 1998).

G. Ovsyannikov, I. Borisenko, et al., "Phase dependance of the superconducting current in YBCO Josephson junctions on bicrystal substrate"Tech. Phys. Lett. 25:11, 913–916 (Nov. 1999).

Y. Pashkin, Y. Nakamura, and J. Tsai, "Matallic resistively coupled single–electron transistor", App. Phys. Lett., 74:1 132–134 (Jan. 4,1999).

E. Il'ichev, V. Zakosarenko et al. "Phase dependence of the Josephson current in inhomogeneous high–T grain–boundry junctions", Physical review B 59:17, 11502–11505 (May 1, 1999).

E. Il'Ichev, V. Zakosarenko et al., "Anomalous periodicity of the current–phase relationship of grain–boundry Josephson junctions in high–T superconductors", Physical Review B, 60:5, 3096–3099 (Aug. 1, 1999).

S.M. Girvin, L.I. Glazman et al., "Quantum Fluctuations and the Single–Junction Coulomb Blockade" Phys, Rev. Lett. 64:26, 3183–3186 (Jun. 25, 1990).

Ambegaokar Vinay, Boldizsar Janko, "Parity Fluctuations between Coulomb Blockaded Superconducting Islands," Phys. Rev. Lett. 75:6, 1154–1157, (Aug. 7, 1995).

R. Riedel, and P. Bagwell, "Current–Phase Relation for Josephson Junctions with d–wave Order Parameters", (Date unknown).

G. Schon, A.D. Zaikin, "Quantum Coherent Effects, Phase Transitions, and the Dissipative Dynamics of Ultra Small Tunnel Junctions", Physics Reports, 198:5/6, 237–412 (1990).

S. Sergeenkov, "Probing mixed s±id pairing state via theroelectric response of SND junction", LANL cond–mat/9805389 (May 29, 1998).

A. Shnirman, and G. Shoen, "Quantum measurements performed with a single–electron transistor", Phys. Rev. B, 57:24, 15400–15407 (Jun. 15, 1998).

A. Shnirman, G. Schon, and Z. Hermon, "Quantum Manipulations of Small Josephson Junctions", Phys. Rev. Lett., 79:12, 2371–2374 (Sep. 22, 1997).

Peter Shor, "Polynomial–time Algorithms for Prime Factorization and Discrete Logarithms on a Quantum Computer", SIAM Journal of Comput., 26:5, 1484–1509 (1997).

M. Sigrist, D.B. Bailey and R.B. Laughlin, "Fractional Vortices as Evidence of Time–Reversal Symmetry Breaking in High–Temperature Superconductors", Phys. Rev. Lett., 74:16, 3249–3252 (Apr 17, 1995).

Y. Takane, and Y. Koyama, "Superconducting Proximity Effect on a One–Dimensional Interacting Electron Gas", J. Phys. Soc. Jpn., 65:11, 3630–3637 (Nov. 1996).

Y. Tanaka, "Josephson Effect between s Wave and dx,2–y2 Wave Superconductors", Phys. Rev. Lett., 72:24, 3871–3874 (Jun. 13, 1994).

Y. Tanaka, and S. Kashiwaya, "Theory of d.c. Josephson current in d–wave superconductor/normal metal/ d–wave superconductor junctions", Materials and Mechanisms of Superconductivity, High temperature Superconductors 5 (1997).

Y. Tanaka, and S. Kashiwaya, "Theory of Josephson effects in anisotropic superconductors", Phys. Rev. B, 56:2, 892–912 (Jul. 1, 1997).

Y. Tanuma, Y. Tanaka, M. Yamashiro, and S. Kashiwaya, "Theory of Local Density of States in d–wave Superconductors around rough surfaces", Proceedings of the 9'h International Symposium on Superconductivity, Springer–Verlag (1997).

Lin Tian, L.S. Levitov et al., "Decoherence of the Superconducting Persistent Current Qubit", LANL cond–mat/9910062 (April 27, 2000).

C.C. Tsuei, J.R. Kirtley et al., "Pairing Symmetry and Flux Quantization in a Tricrystal Superconducting Ring of YBaCuO", Phs. Rev. Lett., 73:4. 593–596 (Jul. 25, 1994).

W.G. Unruh, "Maintaining coherence in Quantum Computers", LANL preprint hep–th/9406058 (Jun. 9, 1994).

B. van Wees, K. Lenssen, and C. Harmans, "Transmission formalism for supercurrent flow in multiprobe superconductor–semiconductor–superconductor devices", Phys. Rev. B, 44:1, 470–473 (Jul. 1, 1991).

A. Volkov, and H. Takayanagi, "Long–range phase coherent effects in the transport properties of mesoscopic superconductor–normal metal structures", Phys. Rev. B, 56:17, 11184–11194 (Nov. 1, 1997).

G. Volovik, "Comment on Magnus Force in Superfluids in superconductors", LANL cond–mat/9707136 (Jul. 1997).

U. Weiss, R. Egger, and M. Sassetti, "Low–temperature nonequilibriom transport in a Luttinger liquid", LANL cond– mat/9509150 (Sep. 25, 1995).

G. Wendin, V.S. Shumeiko, and P. Samuelsson, "Controlling Josephson transport by manipulation of Andreev levels in ballistic mesoscopic junctions"LANL preprint cond–mat/9812092 (1998).

D.A. Wollman, D.J. Van Harlingen et al., "Evidence for dx–y Pairing from the Magnetic Field Modulation of YbaCuO–Pb Josephson Junction", Phys. Rev. Lett., 74:5, 797–800 (Jan. 30, 1995).

S. Yip "Weak Link Between Conventional and Unconventioal Superconductors", J. Low. Temp. Phys. 91, 203 (May 1993) [Hard Copy].

S. Yip, "Josephson current–phase relationships with unconventional Superconductors", Phys. Rev. B., 52:5, 3087–3090(Aug. 1, 1995).

S Yip, and J. Sauls, "Nonlinear Meissner Effect in CuO Superconductors", Phys. Rev. Lett., 69:15, 2264–2267 (Oct. 12, 1992).

Y. Tanaka, and S. Kashiwaya, "Influences of broken time–reversal symmetry on the do Josephson effects in d–wave superconductors"Phys. Rev. B, 58:6, R2948–R2951 (Aug. 1, 1998).

A. M. .Zagoskin, "Magnetic Interference Pattern in a Cleans–wave–Normal Metal–d–wave Superconductor Junction", Phys. Stat. Sol. (b) 202 pg. R9 (1997).

A. M. Zagoskin, "A scalable, tunable qubit based on a clean DND or grain boundary D–D junction", cond–mat/9903170 (Mar. 10, 1999).

A. Zagoskin, "The half–periodic Josephson effect in an s–wave superconductor–normal metal–d–wave superconductor junction", J. Phys.:Condens. Matter, 9, L419 (1997).

A. Zagoskin, and I. Affleck, "Fermi edge singularities: Bound states and finite–size effects", J. Phys. A: Math. Gen., 30, 5743–5765 (1997).

A. Zagoskin, and M. Oshikawa, "Spontaneous magnetic flux and quantum noise in an annular mesoscopic SND junction", J. Phy.: Condens. Matt., 10, L105 (1998).

A. Zagoskin, "Quantum Theory of Many–Body Processes", Springer, 1998.

I. Zapata, F. Sols, and A. Legget, "Josephson effect between trapped Bose–Einstein condensates", LANL cond–mat/9707143 (Jul. 14, 1997).

Kuan Zhang, D.A. Bonn et al., "Measurement of the ab Plane Anistropy of Microwave Surface Impedance of Untwinned YabaCuO Single Crystals", Phys. Rev. Lett., vol. 73:18, 2484–2487 (Oct. 31, 1994).

M. Zhitomirsky and M. Walker, "Electronic States on a Twin Boundary of a d–Wave Superconductor", LANL cond–mat/9705202 (May 20, 1997).

Jian–Xin Zhu, Z. Wang, and H. Tang, "Bound states and Josephson current in mesoscopic s–wave superconductor–normal metal–d–wave superconductor junctions", Phys. Rev. B, 54:10, 7354–7359 (Sep. 1, 1996).

Dagmar Bruss, "Optimal eavesdropping in quantum cryptography with six states", LANL quant–ph/9805019 (Oct. 8, 1998).

Richard Jozsa, Michal Horodecki et al., Universal Quantum Information Compression, LANL quant–ph/9805017 (May 7, 1998).

Robert Tucci, "How to Compile A Quantum Bayesian Net", LANL quant–ph/9805016 (May 7, 1998).

Robert Tucci, "A Rudimentary Quantum Compiler", LANL quant–ph/9805015 (May7, 1998).

N. Linden, S. Massar et al., "Purifying Noisy Entanglement Requires Collective Measurements", LANL quant–ph/9805001 (May 1, 1998).

Leonard J. Schulman and Umesh Vazirani, "Scalable NMR Quantum Computation", LANL quant–ph/9804060 (Apr. 24, 1998).

N. Gasin and H., Bechmann–Pasquinucci, "Bell inequality, Bell states and maximally entangled states for n quibits"LANL quant–ph/9804045 (Apr. 20, 1998).

Lu–Ming Duan and Guang–Can Guo, "Optimal quantum codes for preventing collective amplitude damping", LANL quant–ph/9804014 (Aprl 6, 1998).

Michal Horodecki, Ryszard Horodecki and Pawel Horodecki, "Optimal compression of quantum information for one–qubit source at incomplete data: a new aspect of Jaynes principle", LANL quant–ph/9803080 (Mar. 31,, 1998).

K.M. Gheri, C. Saavedra et al., "Entanglement engineering of one–photon wavepackets using a single–atom source", LANL quant–ph/9802060 (Feb. 25, 1998).

Michael J.W. Hall, "random quantum correlations and density operator distributions", LANL quant–ph/9802052 (Jul. 24, 1998).

D. Bitali and P. Tombesi, "Decoherence control for optical qubits", LANL quant–ph/9802033 (Feb. 12, 1998).

Daniel Gottesman, "Fault–Tolerant Quantum Computation with Higher–Dimensional Systems", LANL quant–ph/980207 (Feb. 2,1998).

A.G. Huibers, S.R. Patel et al., "Distributions of the Conductance and its Parametric Derivatives in Quantum Dots", LANL cond–mat/9801174 (Jan. 17, 1998).

V. Buzek and M. Hillery, "Universal Optimal Cloning of Qubits and Quantum Registers", LANL quant–ph/9801009 (Jan. 7, 1998).

Markus Grassl, Martin Rotteler et al., "Computing Local Invariants of Qubit Systems", LANL quant–ph/9712040 (May 29, 1998).

Michal Horodeck, "Limits for compression of quantum information carried by ensembles of mixed states", LANL quant–ph/9712035 (Dec. 17, 1997).

H.F. Charu, "Quantum Convolutional Error Correcting Codes"LANL quant–ph/9712029 (May 18, 1998).

H.J. Briegel et al., "Quantum communication and the Creation of maximally entangled pairs of atoms over a noisy channel", LANL quant–ph/9712027 (Dec. 11, 1997).

Dagmar Bruss, Artur Ekert and Chiara Macchiavello, "Optimal universal quantum cloning and state estimation", LANL quant–ph/9712019 (Oct. 8, 1998).

S. Bose, P.L. Knight et al., "Implementations of Quantum Logic: Fundamental and Experimental Limits", LANL quant–ph/9712021 (Dec. 10, 1997).

J.F. Poyatos, J.I. Cirac and P. Zoller, "Quantum gates with 'hot'trapped ions", LANL quant–ph/9712012 (Dec. 4, 1997).

William K. Wootters, "Entanglement of Formation of an Arbitrary State of Two Qubits", LANL quant–ph/9709029 (Sep. 13, 1997).

P. Zanardii, "Dissipative Dynamics in a Quantum Register", LANL quant–ph/9708042 (Aug. 25, 1997).

A.M. Steane, "Space, time, parallelism and noise requirements for reliable quantum computing", LANL quant–ph/9708021 (Aug. 12, 1997).

Michal Horodecki, "Reduction criterion of separability and limits for a class of protocols of entanglement distillation", LANL quant–ph/978015 (Apr. 9, 1998).

R. Derka, V. Buzek and A.K. Ekert, "Universal Algorithm for Optimal Estimation of Quantum States from Finite Ensembles", LANL quant–ph/9707028 (Jul. 16, 1997).

E. Knill, & R. Laflamme, "Effective Pure States ofr Bulk Quantum Computation", LANL quant–ph/9706053 (Jun. 24, 1997).

N, Gissin and S. Massar, "Optimal Quantum Cloning Machines", LANL qunat–ph/9705046 (Jul. 17, 1997).

Paolo Zanardi, "Dissipation and Decoherence in a Quantum Register", LANL quant–ph/9705045 (Feb. 6, 1998).

John Preskill, "Reliable Quantum Computers", LANL quant–ph/9705031 (Aug. 26, 1997).

Rudiger Schack, "Using a quantum computer to investigate quantum chaos", LANL quant–ph/9705016 (May 10, 1997).

Eric M. Rains, "Quantum codes of minimum Distance Two", LANL quant–ph/9704043 (Apr. 24, 1997).

F. Vatan, V.P. Roychowdhury et al., "Spatially–Correlated Qubit Errors and Burst–Correcting Quantum Codes", LANL quant–ph/9704019 (May 16, 1997).

V. Buzek, S.L. Braunstein et al., "Quantum copying: A network", LANL quant–ph/9703046 (Mar. 24, 1997).

Scott Hill and William K. Wootters, "Entanglement of a Pair of Quantum Bits", LANL quant–ph/9703041 (Mar. 23, 1997).

Lu–Ming Duan and Guang–Can Guo, "Preserving coherence in quantum computation by pairing the quantum bits"LANL quant–ph/9703040 (Oct. 3, 1997).

Lu–Ming Duan and Guang–Can Guo, "Decoherence of quantum registers", LANL quant–ph/9703036 (Mar. 20, 1997).

Alexander Yu. Vlasov, "Quantum Computations and Images Recognition", LANL quant–ph/9703010 (Mar. 7, 1997).

Eric M. Rains, R.H. Hardin et al., "A Nonadditive Quantum Code", LANL quant–ph/9703002 May 9, 1997).

H.F. Chau, "Five Quantum register Error Correction Code For Higher Spin Systems", LANL quant–ph/9702033 (May 19, 1997).

Daniel Gottesman, "A Theory of Fault–Tolerant Quantum Computation", LANL quant–ph/9702029 (Feb. 17, 1997).

J.I. Cirac and N. Gissin, "Coherent eavesdropping stratagies for the 4 state quantum cryptgraphy protocol", LANL quant–ph/9702002 (Jan. 31, 1997).

Daniel Loss and David P. DiVincenzo, "Quantum Computation with Quantum Dots", LANL cond–mat/9701055 (Jul. 20, 1997).

Christopher A. Fuchs, Nicolas Gisin, Robert B. Griffiths et al., "Optimal eavesdropping in quantum cryptography. I.", LANL quant–ph/9701039 (Jan. 30, 1997).

M. Hillery and V. Buzek, "Quantum copying: Fundamental inequalities", LANL quant–ph/9701034 (Jan. 24, 1997).

Lu–Ming Duan and Guan–Can Guo, "Cooperative loss and decoherence in quantum computation and communication", LANL quant–ph/9701020 (Jan. 16, 1997).

Adriano Barenco, Todd A. Brun et al., "Effects of noise on quantum error correction algorithms", LANL quant–ph/9612047 (Dec. 18, 1996).

Christof Zalka, "Threshold Estimate for Fault Tolerant Quantum computing", LANL quant–ph/9612028 (Jul. 28, 1997).

Lu–Ming Duan and Guang–Can Guo, "Reducing decoherence in quantum computer memory with all quantum bits coupling to the same environment", LANL quant–ph/9612003 (Feb. 2, 1998).

J.A. Sidles, "The AC Stark , Stern–Gerlach, and Quantum Zeno Effects in Interferometric Qubit Readout", LANL quant–ph/9612001 (Nov. 28, 1996).

Asher Peres, "Error Correction and Symmetrization in Quantum Computers", LANL quant–ph/9611046 (Nov. 25, 1996).

D. Aharonov and M. Ben–Or, "Fault–Tolerant Quantum Computation With Constant Error", LANL quant–ph/9611025 (Nov. 15, 1996).

J.F. Poyatos, J.I. Cirac, P. Zoller, "Complete Characterization of a Quantum Process: the Two–Bit Quantum Gate", LANL quant–ph/9611013 (Nov. 10, 1996).

M. Grassl and Th. Beth, "Codes for the Quantum erasure Channel", LANL quant–ph/9610042 (Jan 17, 1997).

C. D'Helon and G.J. Milburn, "Correcting the effects of spontaneous emission on cold–trapped ions", LANL quant–ph/9610031 (May 19, 1997).

Martin B. Plenio and Peter L. Knight, "Decohenrence Limits to quantum computation using trapped ions", LANL quant–ph/9610015 (Oct. 10, 1996).

Dima Mozyrsky, Vladimir Privaman and Mark Hillery, "A Hamiltonian for Quantum Copying", LANL quant–ph/9609018 (May 10, 1997).

Dima Mozyrsky and Vladimir Privman, "Quantum signal splitting that avoids initialization of the targets", LANL quant–ph/9609010 (Aug. 31, 1997).

Asher Peres, "Unitary Dynamics for Quantum Codewords", LANL quant–ph/9609015 (Sep. 18, 1996).

M. Biskup, P. Cejnar and R. Kotecky, "Decoherence and Efficiency of Quantum Error Correction", LANL quant–ph/9608010 (Apr. 7, 1997).

A.R. Calderbank, E.M. Rains et al., "Quantum Error Correction Via Codes Over GF(4)", LANL quant–ph/9608006 (Sep. 10, 1997).

Roberto C. Rey–de–Castro, Mark F. Bocko et al., "Design of an RSFQ Control Circuit to Observe MQC on an rf–S-QUID", (Sep. 18, 2000).

M.H.S. Amin, A.N. Omelyanchouk et al., "Quasiclassical Theory of Spontaneous Currents at Surfaces and Interfaces of d–wave Superconductors", LANL cond–mat/0105486 (Jun. 5, 2001).

Y. Barash, "Quasiparticle Interface States in Junctions Involving d–wave Superconductors", LANL cond–mat/9907277 (Jul. 19, 1999).

K. Constantinian, G. Ovsyannikov, A. Mashtakov, J. Ramos, Z. Ivanov, J. Mygind, and N. Pederson, "Microwave dynamics of YBCO bi–epitaxial Josephson structures", Physica C, 273,21 (1996) [Hard Copy].

Recai Ellialtioglu, Igor O. Kulik, "Quantum Mesoscopic Phenomena and Mesoscopic Devices in Microelectronics", Kluwer Academic Publishers (2000).

M.V. Feigel'man et al., "Andreev Spectroscopy for Superconducting Phase Qubits", LANL cond–mat/9907317 (Jul. 1999).

L Ioffe, V. Geshkenbein et al., "Environmentally decoupled sds–wave Josephson Junctions for quantum computing", Lett. to Nature, vol. 398, 679 (Apr. 22, 1999).

Richard Cleve and Daniel Gottesman, "Efficient Computations of Encodings for Quantum Error Correction", LANL quant–ph/9607030 (Jul. 31, 1996).

Daniel Gottesman, "Pasting quantum codes", LANL quant–ph/9607027 (Jul 31, 1996).

M.A. Nielsen, "The entanglement fidelity and quantum error correction", LANL quant–ph/9606012 (Jun. 13, 1996).

David P. DiVincenzo and Peter W. Shor, "Fault–Tolerant Error Correction with Efficient Quantum Codes", LANL quant–ph/9605031 (Aug. 23, 1996).

A.M. Steane, "Simple Quantum Error Correcting Codes", LANL quant–ph/9605021 (May 15, 1996).

Wojciech Hubert Zurek and Raymond Laflamme, "Quantum Logical Operations on Encode Qubits", LANL quant–ph/9605013 (May 14, 1996).

A.R. Calderbank, E.M. Rains et al., "Quantum Error Correction and Orthogonal Geometry", LANL quant–ph/9605005 (Jul. 2, 1996).

David Deutsch, Artur Ekert et al., Quantum privacey amplification and the security of fquantum cryptography over noisy channels, LANL quant–ph/9604039 (Apr. 30, 1996).

Daniel Gottesman, "A Class of Quantum Error–Correcting Codes Saturating the Quantum Hamming Bound", LANL quant–ph/9604038 (Jul 24, 1996).

Samuel L. Braunstein and John A. Smolin, "Perfect quantum error correction coding in 24 laser pluses", LANL quant–ph/9604036 (Oct. 22, 1996).

Emanuel Knill and Raymond Laflamme, "A Theory of Quantum Error–Correcting Codes", LANL quant–ph/9604034 (Apr. 26, 1996).

P.W. Shor, "Quantum Error–Correcting Codes Need Not Completely Reveal the Error Syndrome", LANL quant–ph/9604006 (Apr. 12, 1996).

Samuel L. Braunstein, "Quantum error correction of dephasing in 3 qubits", LANL quant–ph/9603024 (Mar. 19, 1996).

Richard Cleve and David P. DiVincenzo, "Schumacher's quantum data compression as a quantum computation", LANL quant–ph/9603009 (Mar. 7, 1996).

Paivi Torma and Stig Stenholm, "Polarization in Quantum Computations", LANL quant–ph/9602021 (Feb. 29, 1996).

Raymond Laflamme, Cesar Miquel, Juan Pablo Paz et al., "Perfect Quantum Error Correction Code", LANL quant–ph/9602019 (Feb. 27, 1996).

David Beckman, Amalavoyal N. Chari et al., "Efficient networks for quantum factoring", LANL quant–ph/9602016 (Feb. 21, 1996).

Andrew Steane, "Multiple Particle Interference and Quantum Error Correction", LANL quant–ph/9602016 (May 13, 1996).

Cesar Miquel, Juan Pablo Paz and Roberto Perazzo, "Factoring in a Dissipative Quantum Computer", LANL quant–ph/9601021 (Jan. 23, 1996).

A.R. Calderbank and Peter W. Shor, "Good quantum error–correcting codes exist", LANL quant–ph/9512032 (Apr. 16, 1996).

M.B. Plenio and P.L. Knight, "Realistic lower bound for the factorization time of large numbers on a quantum computer", LANL quant–ph/9512001 (Dec. 2, 1995).

Isaac L. Chuang and R. Laflamme, "Quantum Error Correction by Coding", LANL quant–ph/9511003 (Nov. 3, 1995).

Isaac L. Chuang and Yoshihisa Yamamaoto, "A Simple Quantum Computer", LANL quant–ph/9505011 (May 22, 1995).

Peter W. Shor, "Introduction to Quantum Algorithms", LANL quant–ph/0005003 (Apr. 29, 2000).

H.L. Briegel, W. Dur et al., "Quantum repeaters for communication", LANL quant–ph/9803056 (Mar. 20, 1998).

Jonathan A. Jones, Michele Mosca & Rasmus H. Hansen, "Implementation of a quantum search algorithm on a quantum computer", Lett. to Nature, 393, 344–346 (May 28, 1998).

Lieven M.K. Vandersypen, Matthias Steffen et al., "Experimental Realization of an Order–Finding Algorithm with an NMR Quantum Computer", Phys. Rev. Lett. 85:25, 5452–5455 (Dec. 18, 2000).

T.F. Havel, S.S. Somaroo et al., "Principles and demonstrations of quantum information processing by NMR spectroscopy", LANL quant–ph/9812086 (Jul. 3, 1999).

Y. Nakamura, Yu A. Pahin & J.S. Tsai, "Coherent control of macroscopic quantum states in a single–Cooper–pair box", Lett. to Nature, 398, 786–788 (Apr. 29, 1999).

A.N. Omelyanchouk and Malek Zareyan, "Ballistic Four–Terminal Josephson Junction: Bistable States and Magnetic Flux Transfer", LANL quant–ph/9905139 (May 11, 1999).

R. De Bruyn Ouboter & A.N. Omelyanchouk, "Macroscopic quantum interference effects in superconducting microstructures"Superlattices and Microstructures, 25:5/6, 1005–1017 (1999).

A. Jacobs, R. Kummel and H. Plehn, "Proximity Effect, Andreev Reflections, and Charge Transport in Mesoscopic Superconducting–Semiconducting Heterostructures", LANL quant–ph/9810343 (Nov. 3, 1998).

C. Bruder, A. van Otterlo and G.T. Zimanyi, "Tunnel junctions of unconventional superconductors", Phys. Revw. B, 51:18, 12904–12907 (May 1, 1995).

R.R. Schulz, B. Chesca et al., "Design and realization of an all d–wave dc (pie)–superconducting quantum interference device", Applied Physics Letters, 76:7, 912–914 (Feb. 14, 2000).

F. Tafuri et al., "Feasibility of biepitaxial YBaCuO –Josephson junctions for fundamental studies and potential circuit implementation", Phys. Rev. B, 62:21, 14431–14438 (Dec. 1, 2000).

V.V. Ryazanov, V.A. Oboznov et al., "Coupling of two superconductors through a ferromagnet: evidence for a (pie)–junction", LANL quant–ph/0008364 (Aug. 24, 2000).

Alexander N. Korotkov & Mikko A. Paalanen, "Charge sensitivity of radio frequency single–electron transisitor", App. Phy. Lett., 74:26, 4052–4054 (Jun. 28, 1999).

R.J. Schoelkopf, P. Wahlgren et al., "The Radio–Frequency Single–Electron Transisitor (RF–SET): A Fast and Ultrasensitive Electrometer", Science, 280, 1238–1242, (May 22, 1998).

Gianni Blatter, Vadim B. Geshkenbein and Lev. B., Ioffe, "Design aspects of superconducting–phase quantum bits", Phys. Rev. B, 63, 174511–1 to 174511–9 (2001).

A. Chrestin, T. Matsuyama and U. Merkt, "Evidence for a proximity–induced energy gap in Nb/InAs/Nb junctions", Physical Review B, 55:13, 8457–8465 (April 1, 1997).

Aykutlu Dana, Charles Santori and Yoshihisa Yamamoto, "Electrostatic force spectroscopy of a single InAs quantum dot", LANL cond–mat/0103125 (Mar. 7, 2001).

P.D. Ye, L.W. Engle et al., "High Magnetic Field Microwave Conductivity of 2D Electrons in an Array of Antidots", LANL cond–mat/0103127 (Mar. 6, 2001).

S.G. Lachenmann, I. Friedrich et al. "Charge transport in superconductor/semiconductor/normal–conductor step junctions", Phys. Rev. B, 56:21, 14108–14115 (Dec. 1, 1997).

A.F. Volkov and R. Seviour, "Phase–coherent effects in multiterminal superconductor/normal metal mesoscopic structures", LANL cond–mat/0003370 (Mar. 26, 2000).

A. Jacobs and R. Kummel, "Proximity Effect, Andreev Reflections, and Charge Transport in Mesoscopic Superconducting–Semiconducting Heterostructures", LANL cond–mat/9810343 (Nov. 3, 1998).

Y. Tanaka and Satoshi Kashiwaya, "Theory of the Josephson effect in d–wave superconductors", Phys Rev. B, 53:18, 11957–11960.

M.J. Graf, S–K Yip et al., "Electronic thermal conductivity and the Wiedmann–Franz law for unconventional superconductors", Phys. Rev. B, 53:22, 15147–15161 (Jun. 1, 1996).

A. Martin and C.J. Lambert, "Self–consistent current–voltage characteristics of superconducting nanostructures", Phys. Rev. B, 51:24, 17999–18002 (Jun. 15, 1995).

T. Trerashima, K. Shimura et al., "Superconductivity of One–Unit–Thick YbaCuO Thin Film", Phys. Revw. Lett., 67:10, 1362–1365 (Sep. 2, 1991).

Jina–Xin Zhu and C.S. Ting, "Spontaneous flux in a d–wave superconductor with time–reversal–symmetry–broken pairing state at {110}–oriented boundries", Phys. Revw. B, 60:6, R3739–R3742 (Aug. 1, 1999).

J.J. Hogan–O'Neill, A.M. Martin et al., "Tilt grain–boundry effects in s–and d–wave superconductors", Phys. Rev. B, 60:5, 3568–3571 (Aug. 1, 1999).

T.P. Orlando, J.E. Mooij et al., "Superconducting persistent–current qubit", Phys. Revw, B, 60:22, 15398–15413 (Dec. 1, 1999).

R. de Bruyn Ouboter and A.N. Omelyanchouk, "Four–terminal SQUID:Magnetic Flux Switching in Bistable State and Noise", LANL cond–mat/9805109 (May 9, 1998).

B.J. Vleeming, "The Four–terminal SQUID", Ph.D. Dissertation, Leiden University, The Netherlands, 1971.

E. Knill, "Non–binary Unitary Error Bases and Quantum Codes", LANL quant–ph/9608048 (Oct. 8, 1996).

E. Knill and Raymond Laflamme, "Concatenated Quantum Codes", LANL quant–ph/9608012 (Aug. 8, 1996).

E. Knill "Bounds for Approximation in Total Variation Distance by Quantum Circuits", LANL quant–ph/9508007 (Aug. 8, 1995).

E. Knill, "Approximation by Quantum Circuits", LANL quant–ph/9508006 (Aug. 8, 1995).

Isaac L. Chuang and Yoshihisa Yamamoto, "The Persistent Quantum Bit", LANL quant–ph/9604030 (Apr. 25, 1996).

Alexander N. Korotkov & Mikko A. Paalanen, "Charge Sensitivity of radio frequency single–electron transistor", Appl Phys. Lett., 74:26, 4052–4054 (Jun. 28, 1999).

G. Blonder, M. Tinkham, and T. Klapwijk, "Transition from metallic to tummeling regimes in superconducting microconstrictions: Excess current, charge imbalance and supercurrent conversion", Phys. Rev. B. 25:7, 4515–4532 (Apr. 1, 1982).

I.L.Chuang, N. Gershenfeld, and M. Kubinec, "Experimental Implementation of Fast Quantum Searching", Phys. Rev. Lett., 80:15, 3408–3411 (April 13, 1998).

A. Golub, "Andreev Reflections and Resonance Tunneling in Josephson Junctions", Phys. Rev. B, 52:10, 7458–7468 (Sep. 1, 1995).

A. Huck, A. van Otterlo, and M. Sigrist, "Time–reversal symmetry breaking and spontaneous currents in s–wave/normal–metal/d–wave superconductor Sandwiches", phys. Rev. B, 56:21, 14163–14167 (Dec. 1, 1997).

K.A. Kouznetsov et al., "C–axis Josephson Tunneling Between YBaCuO and Pb: Direct Evidence for Mixed Order Parameter Symmetry in a High–t Superconductor", LANL preprint cond–mat/9705283 (May 27, 1997).

N. Martucciello, C. Soriano, and R. Monaco, "Annular Josephson tunnel junctions in an external magnetic field: The dynamics"Phys. Rev. B, 55:22, (Jun. 1, 1997).

Yuriy Makhlin et al. "Josephson–Junction Qubits and the Readout Process by Single–Electron Transistors", LANL preprint cond–mat/9811029 (Dec. 2, 1999).

R. Seviour, C.J. Lambert, and M. Leadbeater, "Large–scale superconductivity–induced conductance suppression in mesoscopic normal–superconducting structures", LANL preprint cond–mat/9712166 (Dec. 15, 1997).

A. Shnirman and G. Schoen, "Quantum measurement with SET", Phys Rev B, 57:24, 15400–15407, (Jun. 15, 1998).

C.C. Tsuei, J.R. Kirtley, M. Rupp et al., "Pairing Symmetry in Single–Layer Tetragonal Tl2Ba2Cu06+delta superconductors, Cover Story", Science, 271:5247,329 (Jan. 19, 1996).

Alexandre M. Zagoskin & Masaki Oshikawa, "Spontaneous Magnetic Flux and Quantum Noise in a Boubly Connected Mesoscopic SND Junction", LANL Cond–mat/9710260 (Oct. 23, 1997).

J.R. Kirtley et al., "Temprature Dependence of the Half–Integer Magnetic Flux Quantum", Science, 285, 1373–1375 (Aug. 27, 1999).

Lov K. Grover, "The advantages of superposition; how quantum superpositions of logic states would allow computers to provide quicker solutions for hard problems", Science, 5361:280,228 (Apr. 10, 1998).

Neil A. Gershenfeld & Isaac L. Chuang, "Bulk spin resonance quantum computation", Science, 5298:275, 350 (Jan. 17, 1997).

Robert Pool, "The children of the STM; innovations after the scanning tunneling microscope"Science, 247:4943, 634 (Feb. 9, 1990).

N.H. Bonadeo et al., "Coherent Optical Control of the Quantum State of a Single Quantum Dot", Science, 5395:282, 1473 (Nov. 20, 1998).

C.B. Eom, A.F. Marshall et al., "Epitaxial and smooth films of a–axis YbaCuO", Science, 249:4976, 1549 (Sep. 28, 1990).

Robert F. Service, "Superconductivity researchers tease out facts from artifacts; Seventh Conference on Superconductivity and Applications, Buffalo, New York", Science, 265:5181,2014 (Sep. 30, 1994).

Robert F. Service, "High–temperature mystery heats up; superconductors", Science, 5345:278, 1879 (Dec. 12, 1997).

Gary Taubes, "Is the Third time a charm for a superconducting cumputer?", Science, 261:5129, 1670 (Sep. 24, 1993).

Daniel Clery, "New clues to superconductivity", Science, 265:5174, 860 (Aug. 12, 1994).

R. Colin Johnson, "'Einselection' attempts to explain micro/macro worlds", E E Times, at *http://www.eetimes.com/printableArticle?docid=OEG19990419S0043.com* (Apr. 19, 1999).

R. Colin Johnson, "Quantum dots are used to build logic gates", E E Times, at *http://www.eetimes.com/printable/Article?docid=OEG19990428S0015.com* (Apr. 28, 1999).

Yoshiko Hara, "Gains reported in quantum computing", E E Times, at *http://www.eetimes.com/printableArticle?docid=OEG19990706S0030.com*(Jul. 6, 1999).

N. Gisin & S. Popescu, "Quantum Info Defies Logic", Physical Review Focus, at *http://focus.aps.org/v4/st3/html-* (Jul. 16, 1999).

Neil Gershenfeld & Isaac L. Chuang, "Quantum Computing with Molecules", Scientific American, at *http://www.sciam.com/1998/0698issue/0698gershenfeld.html* (Jun. 1998).

(Author Unknown), "Qubit Chip–A superconducting chip suggests a practical path to meduim–scale quantum computing", Scientific American, at *http:/sciam.com/1999/0899scicit5.html* (Aug. 1999).

Leigh John Martinson, "What are Josephson junctions? How do they work?", Scientific American, at http:www.sciam.com/askexpert/physics/physics37/physics37.html (Date Unknown).

M.H.S. Amin et al., "Multi–Terminal Superconducting Phase Qubit", (Unknown Cite), 56–71 (Unknown Date).

Lov K. Grover, "A fast quantum mechanical algorithm for database search", STOC, 212–219 (1996).

D.J. Wineland, C. Monroe, D.M. Meekhof et al., "Quantum State Manipulation of Trapped Atomic Ions", LANL quant–ph/9705022.

E.Il'ichev, V. Zakosarenko et al., "Current–phase relationship of YbaCuO ramp–edge Josephson junction", Applied Physics Letters, 76:1, (Jan. 3, 2000).

\* cited by examiner

QUBIT USING A JOSEPHSON JUNCTION BETWEEN S-WAVE AND D-WAVE SUPERCONDUCTORS

CROSS-REFERENCE TO RELATED APPLICATION

The document is related to and incorporates by reference in its entirety U.S. patent application Ser. No. 09/452,749, entitled "Permanent Readout Superconducting Qubit."

BACKGROUND

1. Field of the Invention

This invention relates to quantum computing and to solid state devices that use superconducting materials to create and maintain coherent quantum states such as required for quantum computing.

2. Description of Related Art

Research on what is now called quantum computing traces back to Richard Feynman, [R. Feynman, Int. J. Theor. Phys., 21, 467–488 (1982)]. Feynman noted that quantum systems are inherently difficult to simulate with conventional computers but that observing the evolution of a quantum system could provide a much faster way to solve the same computational problems. In particular, solving a theory for the behavior of a quantum system commonly involves solving a differential equation related to the Hamiltonian of the quantum system. Observing the behavior of the quantum system provides information regarding the solutions to the equation.

Further efforts in quantum computing were initially concentrated on "software development" or building of the formal theory of quantum computing. Software for quantum computing attempts to set the Hamiltonian of a quantum system to correspond to a problem requiring solution. Milestones in these efforts were the discoveries of the Shor and Grover algorithms. [See P. Shor, SIAM J. of Comput., 26:5, 1484–1509 (1997); L. Grover, Proc. 28th STOC, 212–219 (1996); and A. Kitaev, LANL preprint quant-ph/9511026 (1995)]. In particular, the Shor algorithm permits a quantum computer to factorize natural numbers. The showing that fault-tolerant quantum computation is theoretically possible opened the way for attempts at practical realizations of quantum computers. [See E. Knill, R. Laflamme, and W. Zurek, Science, 279, p. 342 (1998).]

One proposed application of a quantum computer is factoring of large numbers. In such an application, a quantum computer could render obsolete all existing encryption schemes that use the "public key" method. In another application, quantum computers (or even a smaller scale device, a quantum repeater) could allow absolutely safe communication channels, where a message, in principle, cannot be intercepted without being destroyed in the process. [See H. J. Briegel et al., LANL preprint quant-ph/9803056 (1998) and the references therein.]

Quantum computing generally involves initializing the states of N qubits (quantum bits), creating controlled entanglements among the N qubits, allowing the quantum states of the qubits to evolve under the influence of the entanglements, and reading the qubits after they have evolved. A qubit is conventionally a system having two degenerate quantum states, and the initial state of the qubit typically has non-zero probabilities of being found in either degenerate state. Thus, N qubits define an initial state that is a combination of $2^N$ degenerate states. The entanglements control the evolution of the distinguishable quantum states and define calculations that the evolution of the quantum states perform. This evolution, in effect, performs $2^N$ simultaneous calculations. Reading the qubits after evolution is complete determines the states of the qubits and the results of the calculations.

Several physical systems have been proposed for the qubits in a quantum computer. One system uses chemicals having degenerate spin states. Nuclear magnetic resonance (NMR) techniques can read the spin states. These systems have successfully implemented the Shor algorithm for factoring of a natural number (15). However, efforts to expand such systems up to a commercially useful number of qubits face difficult challenges.

Another physical system for implementing a qubit includes a superconducting reservoir, a superconducting island, and a dirty Josephson junction that can transmit a Cooper pair (of electrons) from the reservoir into the island. The island has two degenerate states. One state is electrically neutral, but the other state has an extra Cooper pair on the island. A problem with this system is that the charge of the island in the state having the extra Cooper pair causes long range electric interactions that interfere with the coherence of the state of the qubit. The electric interactions can force the island into a state that definitely has or lacks an extra Cooper pair. Accordingly, the electric interactions can end the evolution of the state before calculations are complete or qubits are read. This phenomenon is commonly referred to as collapsing the wavefunction, loss of coherence, or decoherence.

Research is continuing and seeking a structure that implements a quantum computer having a sufficient number of qubits to perform useful calculations.

SUMMARY

In accordance with the invention, a qubit includes a superconducting island that a Josephson junction separates from a superconducting bank. One of the island and the bank is d-wave superconductor, and the other of the island and the bank is an s-wave superconductor. Accordingly, a ground state current flows at the Josephson junction. The ground state of the supercurrent at the Josephson junction is twice degenerate with the magnetic moment produced by the supercurrent distinguishing the two states. The crystal orientation of the island relative to the bank controls the equilibrium phase difference in the order parameter across the junction and therefore the tunneling probabilities between the ground states.

To read the supercurrent state associated with the island, a single electron transistor (SET) or parity key can connect the island to ground. When the SET is biased to conduct, the current through the SET collapses the supercurrent state to a state with fixed magnetic moment and fixes the supercurrent in that state. Thus, upon completion of a calculation, a control circuit biases the SET to conduct, and the magnetic moment at the Josephson junction is fixed in a particular state and can be dependably read.

To form a quantum register, multiple Josephson junctions can couple respective superconducting islands to a superconducting bank, and a current through the bank can initialize the quantum states of the supercurrents at the junctions. Single electron transistors (SETs) or parity keys interconnect the islands to create controlled entanglements as required for quantum computing. After completion of the computing, other SETs or parity keys connect the islands to ground and freeze the supercurrents at the Josephson junctions into states having definite magnetic moments. This freezing maintains the states for subsequent read operations that measure the local magnetic moments or magnetic flux.

One embodiment of the invention is a quantum computing structure such as a quantum coherer or a quantum register that includes a bank of a superconducting material and an island of a superconducting material, wherein one of the island and the bank is a d-wave superconductor. A normal-conductor portion of a Josephson junction is between the bank and the island. Optionally, a single electron transistor (SET) or a parity key is between the island and ground. The orientation of the supercurrent through the junction is fixed when the SET is conductive and can evolve when the SET is non-conductive. As another option, the structure also includes a second bank of superconducting material, and a Josephson junction between the first and second banks. Operation of a SET between the second bank and the island selectively initializes the supercurrent's quantum state according to the phase of the order parameter in the first or second bank.

Another embodiment of the invention is a quantum register that includes: a bank of a superconducting material; a plurality of islands of superconducting material; and a plurality of Josephson junctions. Each Josephson junction is between the bank and a corresponding one of the islands. One of the island and the bank include a d-wave superconductor. The other of the island and the bank is an s-wave superconductor. The quantum register optionally includes three sets of SETs. Each SET in a first set is between ground and a corresponding one of the islands. Each SET in the second set is between a corresponding pair of the islands. Each SET in the third set is between a second bank and a corresponding one of the islands. The Josephson junction creates an order parameter phase difference between the first and second banks. The second bank and the third set of SETs can be used for selective initialization of supercurrents at the junctions according to the phase of the second bank.

In accordance with another embodiment of the invention, a quantum computing method cools a structure including a bank and an island to a temperature that makes the bank and the island superconducting and suppresses the decoherence processes in the system. The structure includes a Josephson junction between the island and the bank. After the structure is at the appropriate temperature, the method establishes a supercurrent at the junction in a quantum state that is an admixture of a first state having a first magnetic moment and a second state having a second magnetic moment. The supercurrent at the junction is a ground state current arising from use of a d-wave superconductor in the structure and can be set by running a current through the bank. The quantum state evolves according to probabilities for tunneling between the first and second ground states. The evolution performs the quantum computing. Determining a measured magnetic moment or flux due to the supercurrent at the junction determines a result from the quantum computing.

In accordance with another aspect of the invention, determining the measured magnetic moment includes: grounding the island to fix the supercurrent in the first or second state; and measuring the magnetic flux produced by the supercurrent while the island is grounded.

Typically, the quantum register further includes a plurality of junctions, each junction being a clean Josephson junction between the bank and a corresponding island. The quantum states of the supercurrents at the junctions evolve according to the conductivities of transistors that couple islands together. These transistors create entanglements of the quantum states of the islands. The manufacturer of the quantum register can select, for each island, a crystal orientation according to the initial quantum state desired for the island.

BRIEF DESCRIPTION OF THE DRAWINGS

Use of the same reference symbols in different figures indicates similar or identical items.

DETAILED DESCRIPTION

In accordance with an aspect of the invention, quantum computing uses qubits based on the degenerate ground states of the supercurrent at a DD, DND, or SND Josephson junction. The Josephson junctions can be fabricated in useful numbers in a solid state structure. With a d-wave superconductor on at least one side of the Josephson junction, the Josephson junction has non-zero ground state supercurrent in the vicinity of the junction. This ground state supercurrent is either clockwise or counterclockwise in the preferred (so called ab-) plane of the d-wave superconductor. The ground-state supercurrent in the vicinity of each Josephson junction is thus doubly degenerate and provides the basis for a quantum coherer or a qubit for quantum computing in accordance with an embodiment of the invention.

Figure 1A:
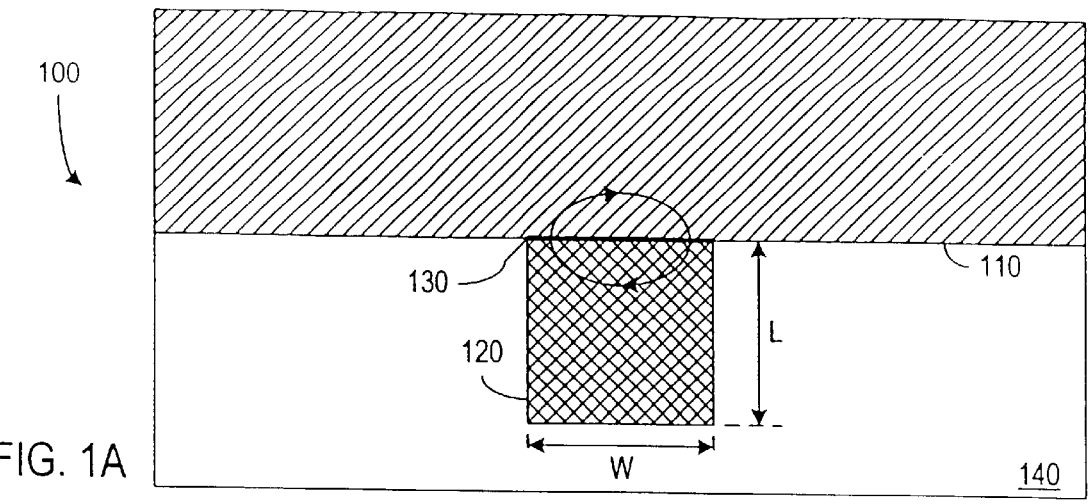
FIGS. 1A, 1B, and 1C are plan views of quantum coherer having a horizontal architecture in accordance with an embodiment of the invention.

FIG. 1A is a plan view of a horizontal quantum coherer 100 in accordance with exemplary embodiments of the invention. Quantum coherer 100 provides a basic block for construction of a qubit but can also be an independent device allowing demonstration of macroscopic quantum tunneling and incoherent quantum noise in a solid state system. As described further below, the macroscopic quantum tunneling in a set of independent quantum coherers permits construction of a random number generator that generates a random series with zero correlation.

Quantum coherer 100 includes a Josephson junction 130 between a large superconducting bank 110 and a mesoscopic, superconducting island 120 formed on an insulating substrate 140. At least one of bank 110 and island 120 is a d-wave superconductor, for example, a high-Tc cuprate such as $YBa_2Cu_3O_{7-x}$ or any superconductor in which the Cooper pairs are in a state with non-zero orbital angular momentum. In some embodiments of the invention, one of bank 110 and island 120 is an s-wave superconductor. In this embodiment, junction 130 is clean in that the junction is conducting (e.g., a normal conducting layer or a grain boundary) and lacks scattering sites. As described further below, a grain boundary between a superconductor bank 110 and a superconductor island 120 can create Josephson junction 130.

In some embodiments, bank 110 is an s-wave superconducting material such as Niobium (Nb), and island 120 is a d-wave superconductor. In some embodiments, bank 110 is a d-wave superconducting material, and island 120 is an s-wave superconductor. Junction 130 includes a normal conductor between bank 110 and island 120. The normal conductor can be any conductive material that forms a good contact with both the d-wave and s-wave superconductors, has a large elastic scattering length, and remains a normal conductor at the operating temperature of quantum coherer 100 (typically between about 10° K and about 1° K). In particular, gold (Au) is a suitable normal conductor for junction 130.

In the exemplary embodiments, bank 110 is a chip of superconducting material about 1 $\mu$m or more in length and width. The thickness of bank 110 is not critical but generally should not exceed that of the mesoscopic island 120. Island 120 is mesoscopic (i.e., has a size such that a single excess Cooper pair is noticeable) and typically has a width W about 0.2 $\mu$m or less, a length L about 0.5 $\mu$m or less, and thickness about 0.2 $\mu$m or less.

Quantum coherer 100 can be formed using pattern techniques that are common in integrated circuit manufacture. In systems where both bank 110 and island 120 are d-wave superconductors, substrate 140 is a bi-crystal substrate such as a strontium-titanate bi-crystal substrate available from KagakuGijutsu-sha of Tokyo, Japan. The fabrication process begins by growing a film of a high-Tc cuprate having a thickness of about 0.2 microns on substrate 140. Regions of the high-Tc cuprate film inherit different crystal orientation from underlying substrate 140, and a grain boundary forms between the two different regions. Such a film can be grown using pulsed laser deposition, which uses a laser beam to sputter the high-Tc cuprate onto substrate 140. A photolithographic process then masks and etches the film to form island 120 (typically as one of several islands) adjacent bank 110. For islands 120 of the small size desired, the etching or patterning process can use an electron beam to remove part of the d-wave superconductor and leave island 120 with the desired dimensions. Il'ichev et al., LANL, cond-mat/9811017, p.2 describes known fabrication technique using high-Tc cuprates and is hereby incorporated by reference in its entirety.

In embodiments where one of bank 110 or island 120 is an s-wave superconductor, the fabrication process starts by depositing a film of d-wave superconductor on substrate 140. The film is etched (if necessary) to limit the boundaries of the d-wave superconductor to the desired boundaries of bank 110 or island 120. Alternatively, bank 110 or island 120 can be etched from a bulk d-wave film. A normal conductor such as gold is deposited and patterned to leave material for junctions 130. Finally, a film of s-wave superconductor is deposited and patterned (if necessary) to limit the boundaries of the s-wave superconductor for bank 110 or island 120.

For operation, quantum coherer 100 is cooled to a temperature less than about 10° K so that bank 110 and island 120 are superconducting and Josephson junction 130 is operative. The operating temperature of quantum coherer 100 is far below the threshold temperature for superconductivity of the d-wave superconductor to suppress thermal sources of decoherence. In particular, the low temperature suppresses decoherence processes due to inelastic scattering. If quantum coherer 100 contains an s-wave superconductor, the operating temperature is below the transition temperature of the s-wave superconductor (e.g., below 9.25° K for pure Nb).

At junction 130, the d-wave superconductor causes a non-zero supercurrent in the ground state, and the ground state of the supercurrent is twice degenerate if no external electromagnetic field is applied. Two degenerate states having the ground state energy and definite magnetic moment correspond to minimal supercurrents circulating through Josephson junction 130 in clockwise and counter-clockwise senses, in a preferred plane of the crystal structures of bank 110 and/or island 120. In accordance with current theoretical descriptions, e.g., the Ginzburg-Landau theory of superconductivity, an order parameter $\Psi$ describes supercurrents in superconductors, and a phase difference $\Delta\phi$ in the order parameter when crossing junction 130 indicates the state or direction of the supercurrent. The two states associated with the supercurrent in island 120 permit quantum computing as described further below.

Quantum coherer 100 operates at a temperature below about 10° K so that bank 110 and island 120 are superconducting and thermal excitations do not interfere with the coherence of the quantum state associated with the supercurrent in island 120. An external circuit (not shown) can generate an electric field that causes a current through bank 110 to the right or left that initializes quantum coherer 100 to a quantum state corresponding to a known superposition of the clockwise and counterclockwise supercurrent states at junction 130. Alternatively, temporary application of a magnetic field can also initialize the state of island 120 by temporarily breaking the degeneracy in the two ground state energies. Subsequent quantum tunneling between the ground states causes the state associated with island 120 to evolve.

The function of crystal orientation is detailed in the prior art for a junction where both the bank 110 and island 120 are d-wave superconductors see A. M. Zagoskin, "A scalable, tunable qubit, based on a clean DND or grain boundary D-D junction", LANL preprint cond-mat/9903170. In this example, island 120 has a crystal orientation that differes from that of bank 130. Since the Josephson junction is a clean junction, the difference in crystal orientation is a primary factor in determining the magnitude of the equilibrium phase difference $\Delta\phi$ in the order parameter $\Psi$ at the junction, and the magnitude of the phase difference $\Delta\phi$ is not restricted to $\pi/2$ as typically would be the case with a tunneling junction. (The two degenerate states of the junction respectively correspond to positive and negative phase differences $\Delta\phi$.) Accordingly, the choice of lattice mismatch between bank 110 and island 120 selects the phase difference $\Delta\phi$. This permits selection of tunneling rates between the ground states within an exponentially wide range by selecting the lattice mismatch to make the phase difference $\Delta\phi$ larger or smaller. Similar effects hold for a structure where one of the bank 110 or island 120 is a d-wave superconductor and the other is an s-wave superconductor, as in embodiments of the present invention.

Another advantage of having a clean junction is a difference in crystal orientations (or $\Delta\phi$) that can restrict the ground states to having a low probability of being in states having excess charge on island 120. Thus, the state of island 120 has weaker electrostatic interactions with the surroundings. This reduces or eliminates a source of decoherence in the state of island 120, and the state of island 120 can continue to evolve for a relatively long period without collapsing the wavefunction. The spontaneous supercurrent at Josephson junction 130 creates spontaneous magnetization, and the direction of the current and the magnetization distinguish the working quantum states of quantum coherer 100. However, the magnetic reactions with the surroundings are weak enough to avoid significant problems with decoherence.

Figure 1B:
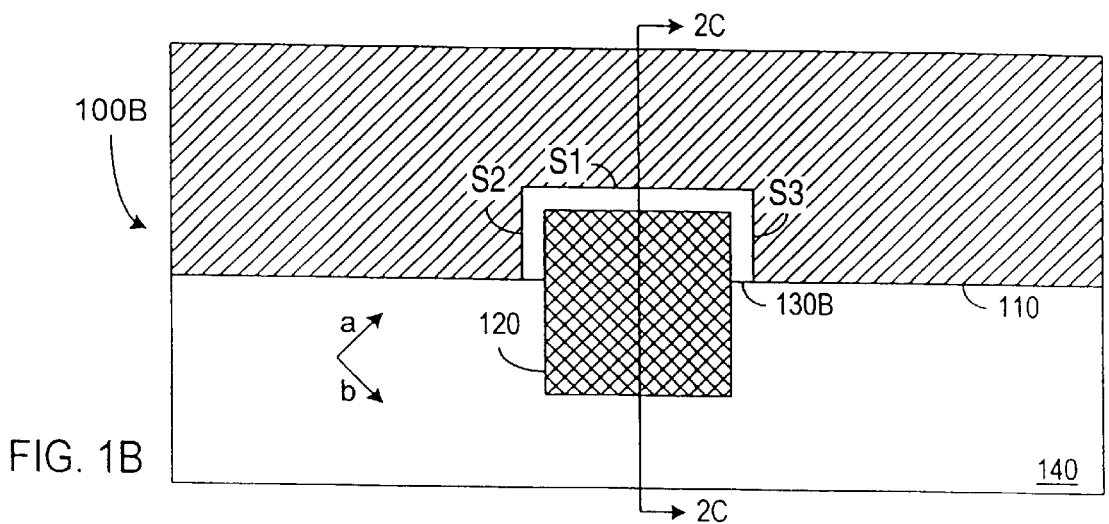

The geometry or architecture of Josephson junction 130 in quantum coherer 100 can be varied in a variety of ways that facilitate selection of the phase difference $\Delta\phi$ in the superconducting order parameter. FIG. 1B is a plan view of a quantum coherer 100B according to another embodiment of the invention. Quantum coherer 100B includes a Josephson junction 130B that separates bank 110 from mesoscopic island 120. Josephson junction 130B is particularly suited for the embodiments of the invention where one of bank 110 and island 120 is an s-wave superconductor and the other one of bank 110 and island 120 is a d-wave superconductor. Bank 110, island 120, and junction 130B are respectively formed in the same maimer described above for bank 110, island 120, and junction 130 of FIG. 1A.

Quantum coherer 100B differs from quantum coherer 100 in crystal orientation of island 120 relative to bank 110 across junction 130B. The a-b plane of the d-wave superconductor lies in the plane of FIG. 1B. In coherer 100B, junction 130B has three regions, regions S1, S2, and S3, where the relative crystal orientation of bank 110 and island 120 across region S1 differs from the relative crystal orientation across regions S2 and S3. The lengths of regions S1, S2, and S3 can be changed to adjust the equilibrium phase difference in the superconducting order parameter across junction 213 and the magnitude of the magnetic flux of the ground state supercurrent.

Figure 1C:
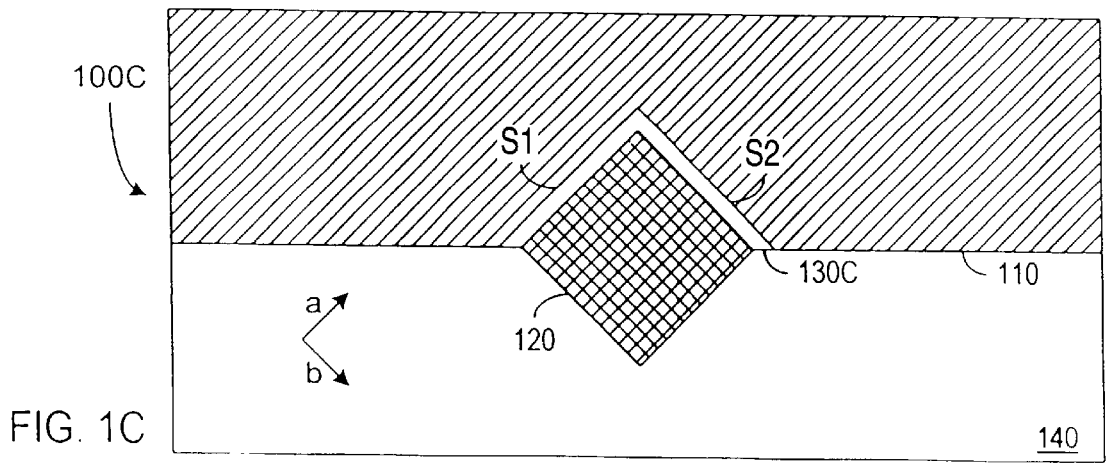

FIG. 1C shows a plan view of another horizontal quantum coherer 100C in which a Josephson junction 130C has two regions S1 and S2 with different crystal orientations across the regions S1 and S2. As in coherer 100B, changing the orientation of island 120 and the lengths of regions S1 and S2 can adjust the phase difference in the superconducting order parameter between bank 110 and island 120.

Figure 2A:
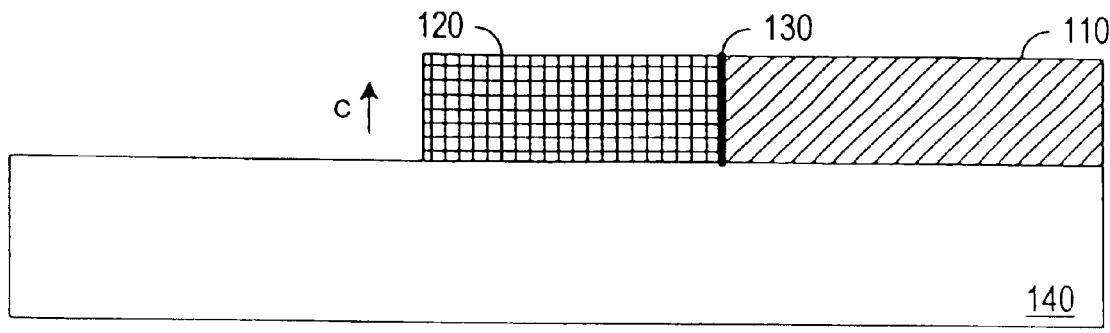
FIGS. 2A, 2B, and 2C are cross-sectional views of horizontal quantum coherers that in accordance with embodiments of the invention.
Figure 2B:
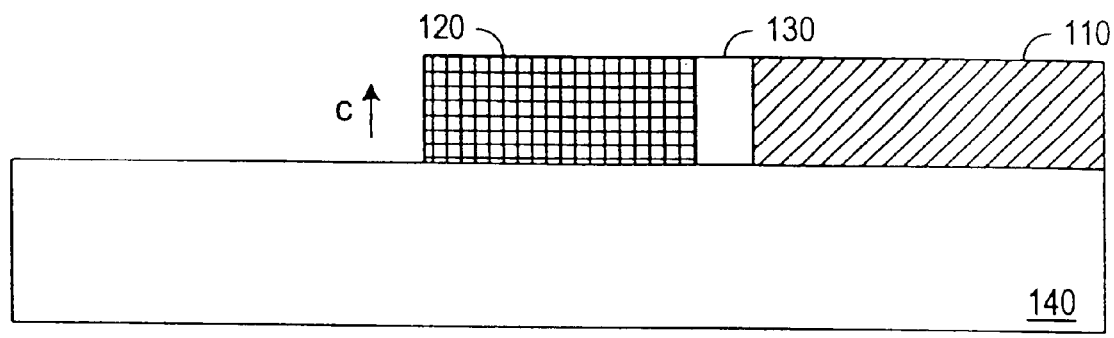

The cross-section of junction 130 also has several alternative configurations. FIG. 2A shows a cross-sectional view of a horizontal quantum coherer where both bank 110 and island 120 are d-wave superconductors and a grain boundary forms Josephson junction 130. FIG. 2B shows a cross-sectional view of a horizontal quantum coherer where a normal conductor between bank 110 and island 120 forms Josephson junction 130 as described in Zagoskin, LANL, preprint cond-mat/9903170. The normal conductor is suitable when both bank 110 and island 120 are d-wave superconductors or when one of bank 110 and island 120 is an s-wave superconductor.

Figure 2C:
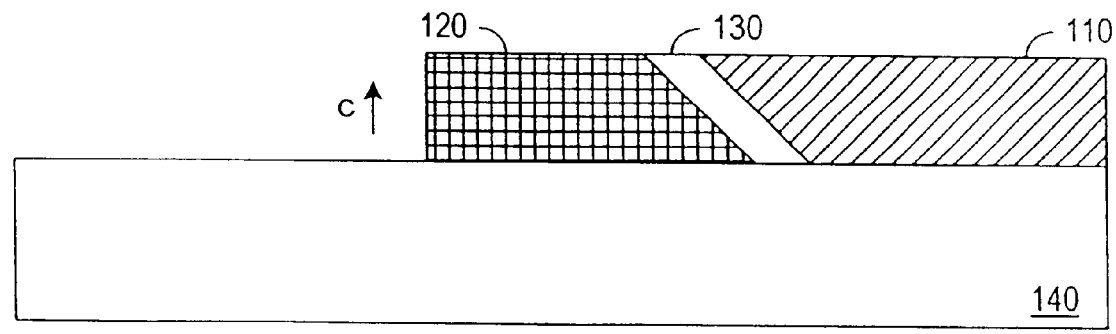

FIG. 2C illustrates that surface of the Josephson junction 130 is not required to be perpendicular to the preferred plane (the ab-plane) of the supercurrent in the d-wave superconductor. In FIG. 2C, junction 130 is at an angle relative to the c-direction of the d-wave superconductor. Normally, current techniques for growing a high-Tc superconductor or the deposition of the d-wave superconductor film on substrate 140 keeps the ab-plane of the d-wave superconductor parallel to the surface of substrate 140 and the c-direction perpendicular to the surface. Conventional patterning of the film creates an edge parallel to the c-direction. However, an anisotropic etch process such as electron beam etching with substrate 140 at an angle to the beam direction can create a non-zero angle between the edge of the d-wave film and the c-direction. This angle provides another degree of freedom in selecting a configuration that provides the desired phase difference $\Delta\phi$ in the superconducting order parameter.

Figure 3A:
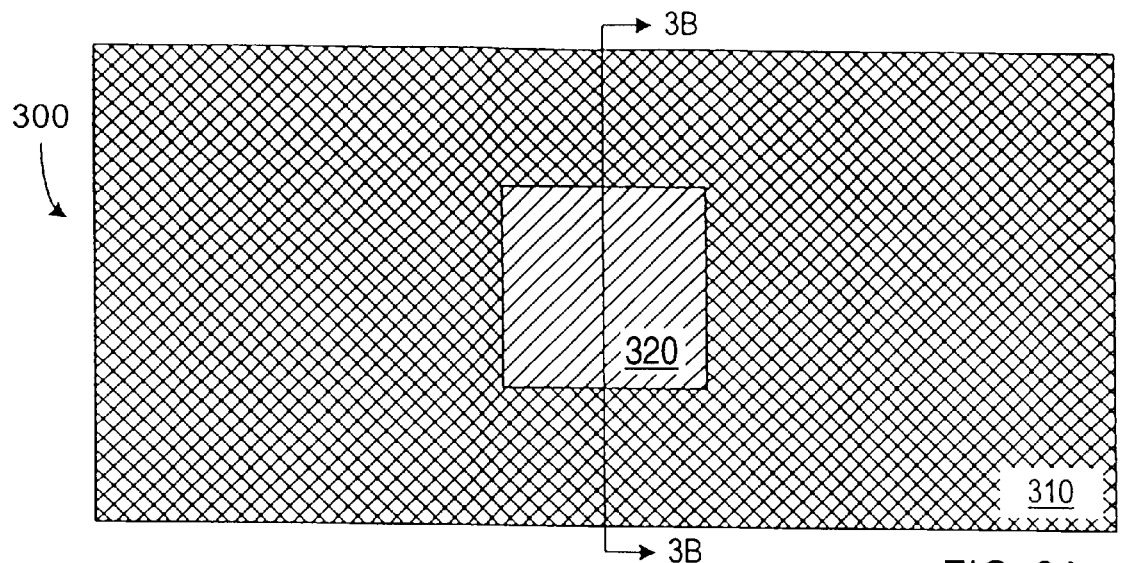
FIGS. 3A and 3B are respectively plan and cross-sectional views of a vertical quantum coherer in accordance with an embodiment of the invention.
Figure 3B:
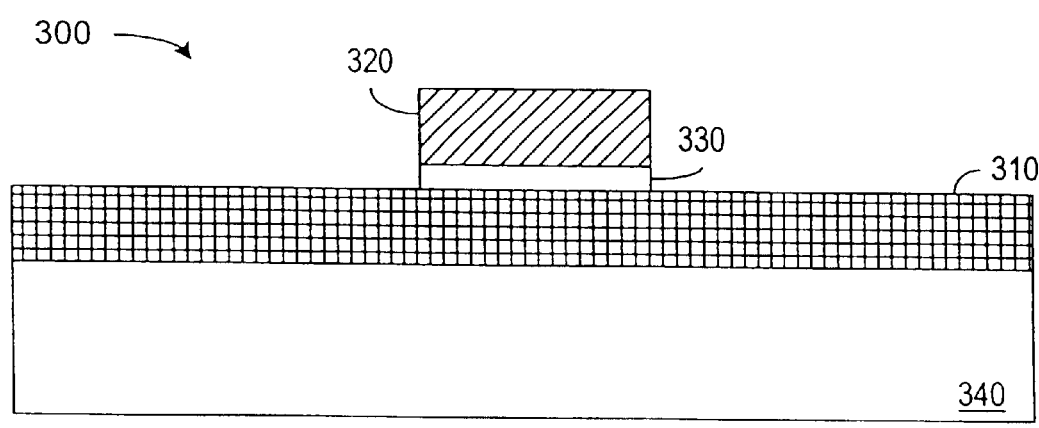

FIGS. 3A and 3B respectively show a plan view and a cross-sectional view of a vertical quantum coherer 300 in accordance with an embodiment of the invention. The terms "horizontal" and "vertical" as applied to the quantum coherers described herein indicate the predominant plane of the ground state supercurrents. Quantum coherer 300 includes an insulating substrate 340, a superconducting bank 310, a Josephson junction 330, and a mesoscopic superconducting island 320. A fabrication process for quantum coherer 300 grows a d-wave superconductor film to a thickness between about 0.2 μm and about 0.5 μm on substrate 340. Deposition of a normal conductor such as gold on the d-wave superconductor film forms a normal conductor film between about 0.1 μm and about 0.3 μm thick. Deposition of an s-wave superconductor such as Nb on the normal conductive film forms an s-wave superconductor film less than about 0.2 μm thick. Finally, patterning of the s-wave superconductor film and the normal conductor film creates mesoscopic, superconductive island 320 that Josephson junction 330 separated from superconductive bank 310.

Figure 4A:
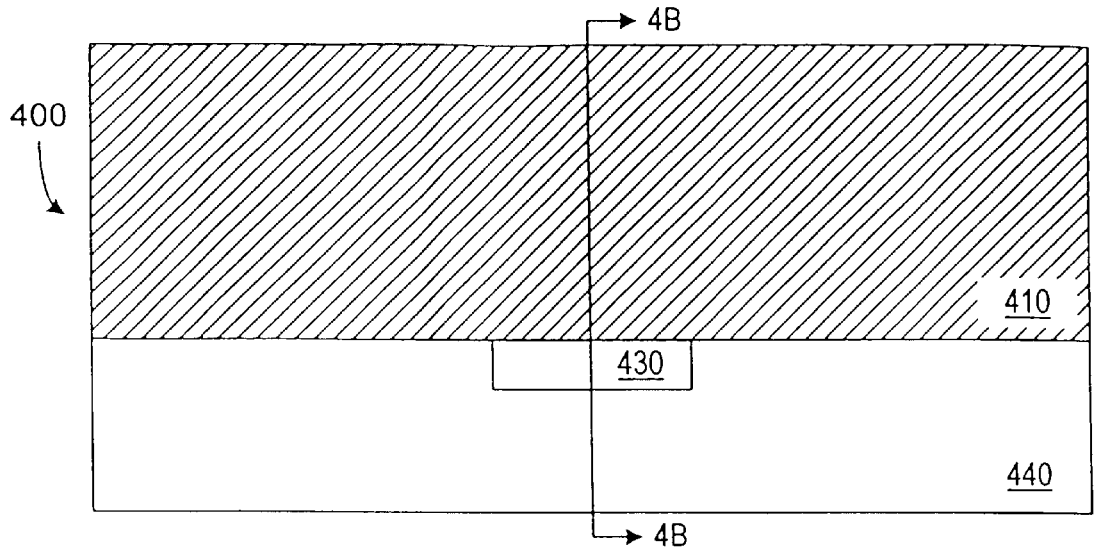
FIGS. 4A and 4B are respectively plan and cross-sectional views of a vertical quantum coherer in accordance with another embodiment of the invention.
Figure 4B:
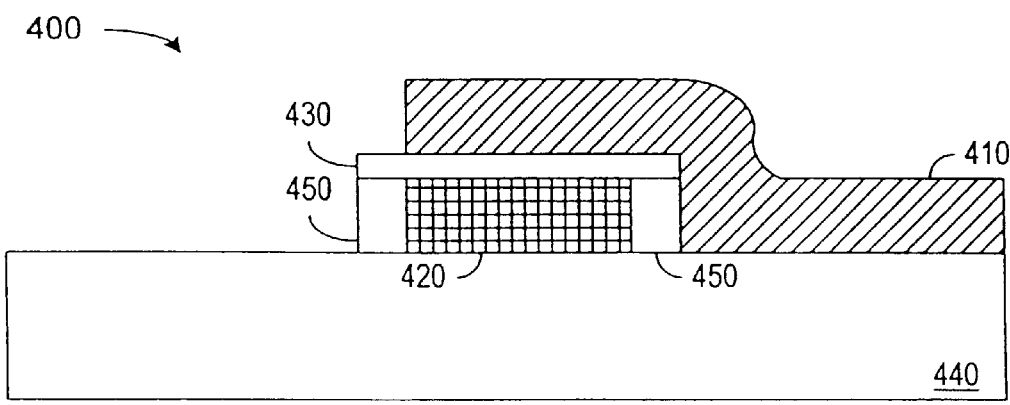

FIGS. 4A and 4B respectively show plan and cross-sectional views of a quantum coherer 400 having a vertical architecture according to another embodiment of the invention. Quantum coherer 400 includes a superconductor bank 410, a mesoscopic superconductor island 420, and a Josephson junction 430, formed on an insulating substrate 440. A fabrication process for quantum coherer 400 grows a d-wave superconductor film on substrate 440 to a thickness less than about 0.2 μm and patterns the film to form island 420. Insulative sidewall spacers 450 are then formed on island 420. Such spacers can be conventionally formed by depositing and patterning an insulative layer or by a self-aligned process that anisotropically etches a conformal insulative layer formed on substrate 440 and island 420. A layer of a normal conductor such as gold is deposited on the resulting structure to a thickness between about 0.1 μm and about 0.3 μm and patterned to form a normal conductive region of Josephson junction 430. The normal conductive region extends over island 420 and at least part of sidewall spacers 440. Finally, a layer of an s-wave superconductor is deposited on the structure and patterned (if necessary) to form bank 410. The thickness of bank 410 is not critical to the operation of quantum coherer 400.

Figure 5:
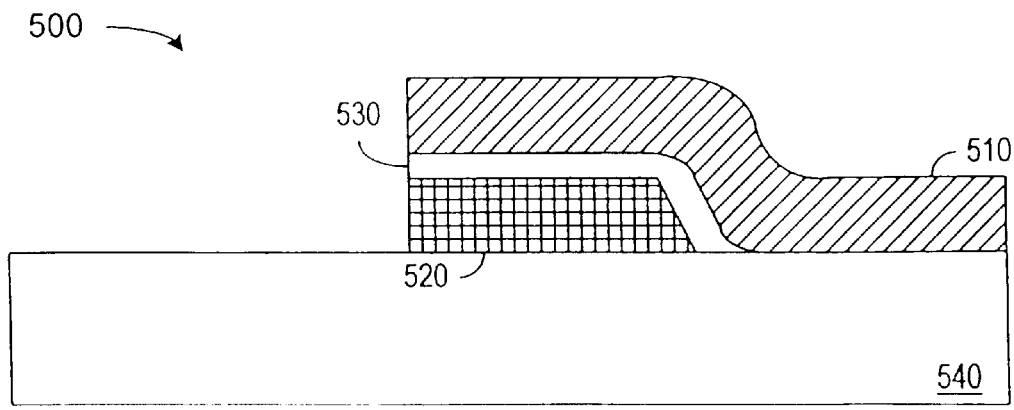
FIG. 5 is cross-sectional views of a hybrid vertical/horizontal quantum coherer in accordance with an embodiment of the invention.

FIG. 5 shows a cross-sectional view of a quantum coherer 500 having a hybrid vertical/horizontal architecture according to another embodiment of the invention. Quantum coherer 500 includes a superconductor bank 510, a mesoscopic superconductor island 520, and a Josephson junction 530, formed on an insulating substrate 540. A fabrication process for quantum coherer 500 grows a d-wave superconductor film on substrate 440 to a thickness less than about 0.2 μm and patterns the film to form island 520. The patterning can leave sides of island 520 perpendicular to the surface of substrate 540 or any desired angle. A layer of a normal conductor such as gold is deposited on the resulting structure to a thickness between about 0.1 μm and about 0.3 μm and patterned to form a normal conductive region of Josephson junction 530. In this embodiment, the normal conductive region extends over island 520 and is in contact with at least one sidewall of island 520. Finally, a layer of an s-wave superconductor is deposited on the structure and patterned (if necessary) to form bank 510. The phase difference in the superconducting order parameter from bank 510 to island 520 depends on the relative crystal orientation between the top surface of island and the overlying part of bank 510 and the relative crystal orientation of the side of island 120 and the adjacent part of bank 510.

The quantum coherers such as described above avoid the destructive effects of low energy thermal excitations for several reasons. In particular, the superconducting gap (between the ground state energy of Cooper pairs and the higher energy states of electrons) and the small phase volume available in the nodes of the d-wave order parameter in the superconducting island and the bank suppress the low energy elementary excitations. Moreover, near the boundary, there is a possibility of specific admixture of s-wave superconductivity restoring the finite energy gap on all of the Fermi surface. In a normal layer of the junction, where the order parameter is suppressed, the elementary excitations are gapped due to size quantization.

One application of the quantum coherers is in a random number generator. In this application, the quantum states of a set of quantum coherers evolve to a state where each quantum coherer has an equal (or at least known) probability of being in each of the current direction states. The current-direction states are then determined, for example, by observing each quantum coherer with a magnetic force microscope or another magnetic probe. Each determined state (clockwise or counterclockwise) corresponds to a bit value (0 or 1) so that the collection of determined states provides a random binary value having as many bits as there are quantum coherers in the set. Quantum theory indicates that a series of bits thus generated are random without correlation or repetition.

Figure 6:
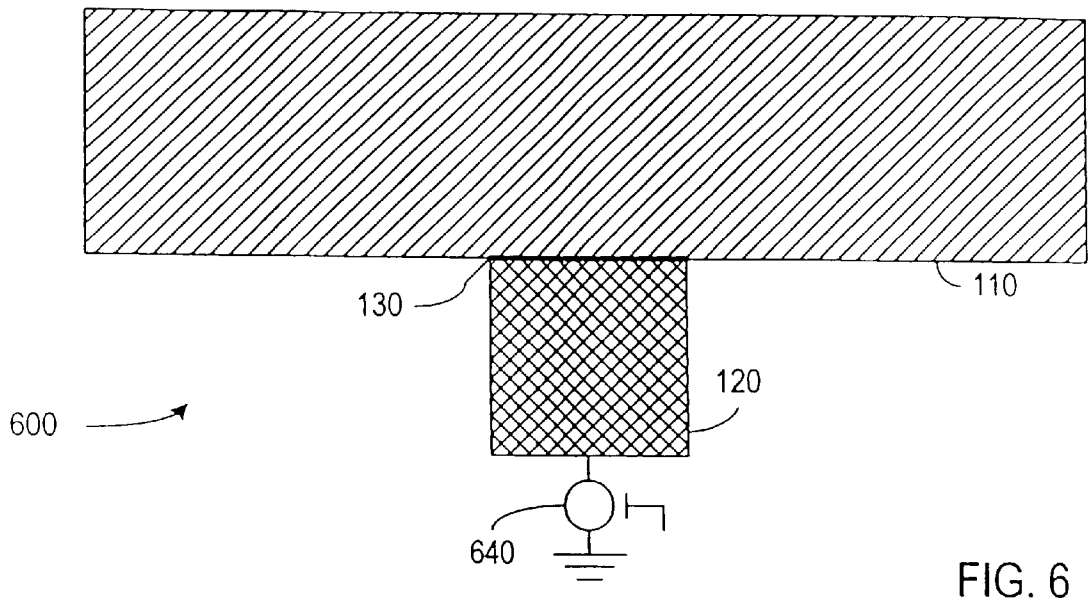
FIG. 6 shows a qubit having a single electron transistor that freezes the state of the qubit.

FIG. 6 shows an embodiment of a qubit 600 based on the architecture of quantum coherer 100. Qubit 600 is merely an illustrative embodiment of a qubit in accordance with the invention, and other embodiments of a qubit can employ other quantum coherer architectures such as but not limited to those described above.

Qubit 600 combines quantum coherer 100 with external circuitry that allows freezing of the quantum tunneling between the two degenerate supercurrent ground states. To freeze the quantum state of the supercurrent, a parity key or single electron transistor (SET) 640 connects island 120 to ground (normal or superconducting). The free passage of electrons between island 120 and ground collapses the wavefunction of the supercurrent at junction 130 into one of the ground states (a state corresponding to either phase difference $\Delta\phi$ or $-\Delta\phi$) having definite magnetic moment. (The probability of collapsing to a particular phase difference $\Delta\phi$ or $-\Delta\phi$ depends on probability amplitudes in the ground state before the collapse.) Island 120 remains in the definite magnetic moment state while SET 640 continues to connect island 120 to ground, and that state, while frozen, can be measured to read out and determine the results of a calculation. Changing the gate voltage of SET 640 can stop the flow of electrons to or from ground and thereby allow island 120 to evolve according to the tunneling rate between the ground states.

Single electron transistors (SETs) are known and described, for example, by A. Zagoskin, "Quantum Theory of Many-Body Processes," (Springer, 1998) which is hereby incorporated by reference in its entirety. SETs include a grain capacitively coupled to two devices (e.g., island 120 and ground). An electron or Cooper pair can tunnel from either device onto the grain when the grain is uncharged. However, the grain is small enough that once an electron or Cooper pair tunnels onto the grain, the charging of the grain electrically repels and prevents further tunneling onto the grain. A gate associated with the grain can change the voltage of grain to shut off or otherwise control the tunneling rate. P. Joyez et al., "Observation of Parity-Induced Suppression of Josephson Tunneling in the Superconducting Single Electron Transistor", Physical Review Letters, Vol. 72, p. 2458, Apr. 11, 1994 describes operation and manufacture of single electron transistors and is also incorporated by reference herein in its entirety.

Qubit 600 is referred to herein as a permanent readout superconducting qubit (PRSQ) because, barring thermal fluctuations, the spontaneous magnetic flux of a frozen (grounded and collapsed) qubit remains fixed. Accordingly, a readout device such as a magnetic force microscope (MFM) tip or a superconducting quantum interferometer device (SQUID) loop can contact the system when the decohering effects of the read out device will not disrupt the qubit result. The readout device measures the weak local magnetic fields that the spontaneous supercurrents (clockwise or counterclockwise) cause in the vicinity of [the] Josephson junction 120. More particularly, the MFM scans a microscopic magnetized tip attached to a cantilever across the surface and measures deformation of the cantilever as the mechanical force that acts on the magnetized tip. Alternatively, a SQUID loop detects the magnetic flux in the vicinity of the Josephson junction 130. Another possible read out system may use a difference in the absorption of circularly polarized microwave radiation due to the clockwise or counterclockwise currents at the junction.

Figure 7:
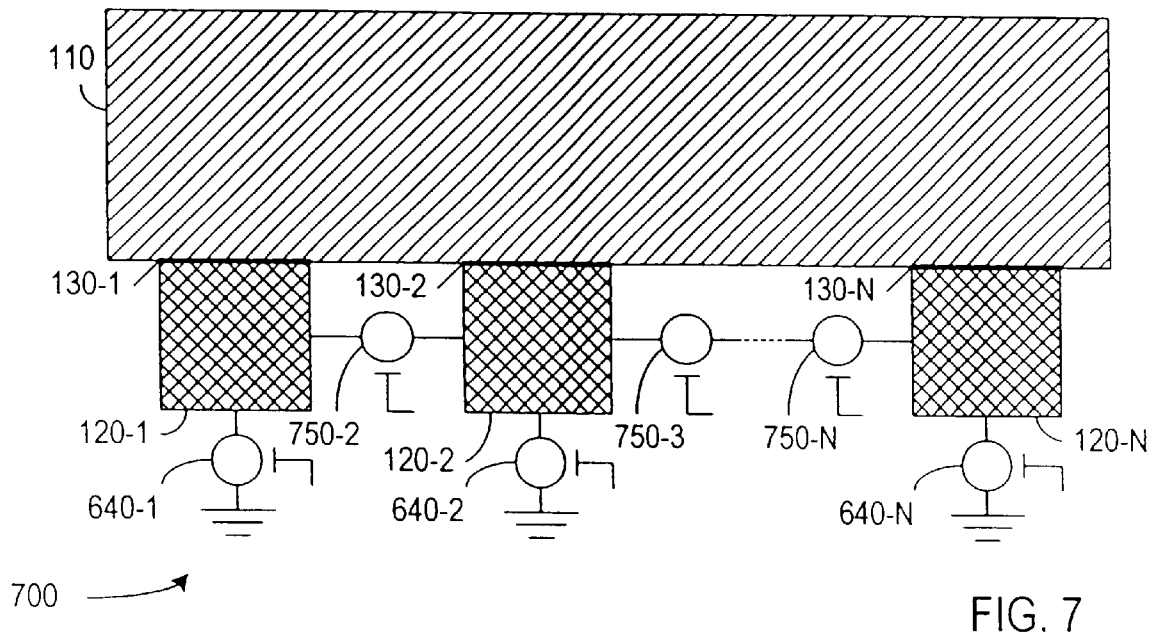
FIG. 7 shows a structure including a collection of qubits having single electron transistors that create entanglements among the qubits and facilitate read out of the qubits.

FIG. 7 shows a PRSQ register 700 including several islands 120-1 to 120-N in contact with a bank 110. In the exemplary embodiment, islands 120-1 to 120-N and bank 110 are made of a d-wave superconductor at a temperature of about 10° K as described above. Grain boundaries are between bank 110 and respective islands 120-1 to 120-N and form clean Josephson junctions 130-1 to 130-N, respectively. Alternatively, bank 110 can be an s-wave superconductor that a normal conductor (not shown) separates from islands 120-1 to 120-N to form Josephson junctions 130-1 to 130-N. The crystal orientations of islands 120-1 to 120-N differ from the crystal orientation of bank 110 and control equilibrium phase differences $\Delta\phi_1$ to $\Delta\phi_N$ between the phase of the order parameter in bank 110 and the phases of the order parameter in islands 120-1 to 120-N. Phases $\Delta\phi_1$ to $\Delta\phi_N$ can differ from each other or all be the same. A manufacturer of PRSQ register 700 selects phases $\Delta\phi_1$ to $\Delta\phi_N$ according to the application of register 700 and designs a substrate that will create the desired grain boundaries or orientations when d-wave superconductive material is deposited or grown on the substrate.

To facilitate readout from PRSQ register 700, SETs 640-1 to 640-N are between islands 120-1 to 120-N and ground. Turning on SETs 640-1 to 640-N permits free current between ground and respective islands 120-1 to 120-N to collapse and freeze the quantum states of the supercurrents at respective junctions 130-1 to 130-N. The techniques described above can then read the quantum states.

Register 700 also includes SETs 750-2 to 750-N that connect adjacent islands 120-1 to 120-N. Voltages applied to the gates of SETs 750-2 to 750-N control currents or tunneling probabilities between islands and thereby create controllable entanglements among the quantum states of supercurrents in register 700.

In FIG. 7, islands 120-1 to 120-N are in a linear array, and each island 120-2 to 120-N has a corresponding SET 750-2 to 750-N that connects to the respective preceding islands 750-1 to 750-(N−1) in the linear array. Alternative configurations are possible, for example, an additional SET can connect island 120-1 to island 120-N in a ring. In another embodiment, each island connects through multiple SETs to other islands, for example, in a two-dimensional array of qubits. The configuration and connections of islands can be selected according to the function of or program for PRSQ register 700.

To execute quantum computing with PRSQ register 700, the states of the qubits corresponding to islands 120-1 to 120-N are first initialized in the same manner as described above, for example, by running a current through bank 110. All of SETs 640-1 to 640-N are off to prevent interaction with ground, and the voltages on the gates of SETs 750-2 to 750-N are adjusted according to the desired calculation. SETs 750-2 to 750-N create entanglements that enable tunneling between the ground states of PRSQ register 700. After the quantum state of PRSQ register 700 evolves to complete the desired calculation, SETs 750-2 to 750-N are turned off to decouple the qubits, and then SETs 640-1 to 640-N are turned on. This collapses the wavefunction so that the supercurrent at each Josephson junction 130-1 to 130-N has a definite magnetic moment. One or more read out devices sense the magnetic moments of the supercurrents at junctions 130-1 to 130-N to determine the results of the quantum computing.

The time required for a calculation and the interpretation of the read out results depends on the calculation performed. Such issues are the subject of many papers on quantum computing. The structures described herein can perform such calculations provided that the structures provide a sufficient number of qubits and a decoherence time that is longer than the required calculation time. The structures can typically achieve longer coherence times by decreasing the operating temperature.

Figure 8:
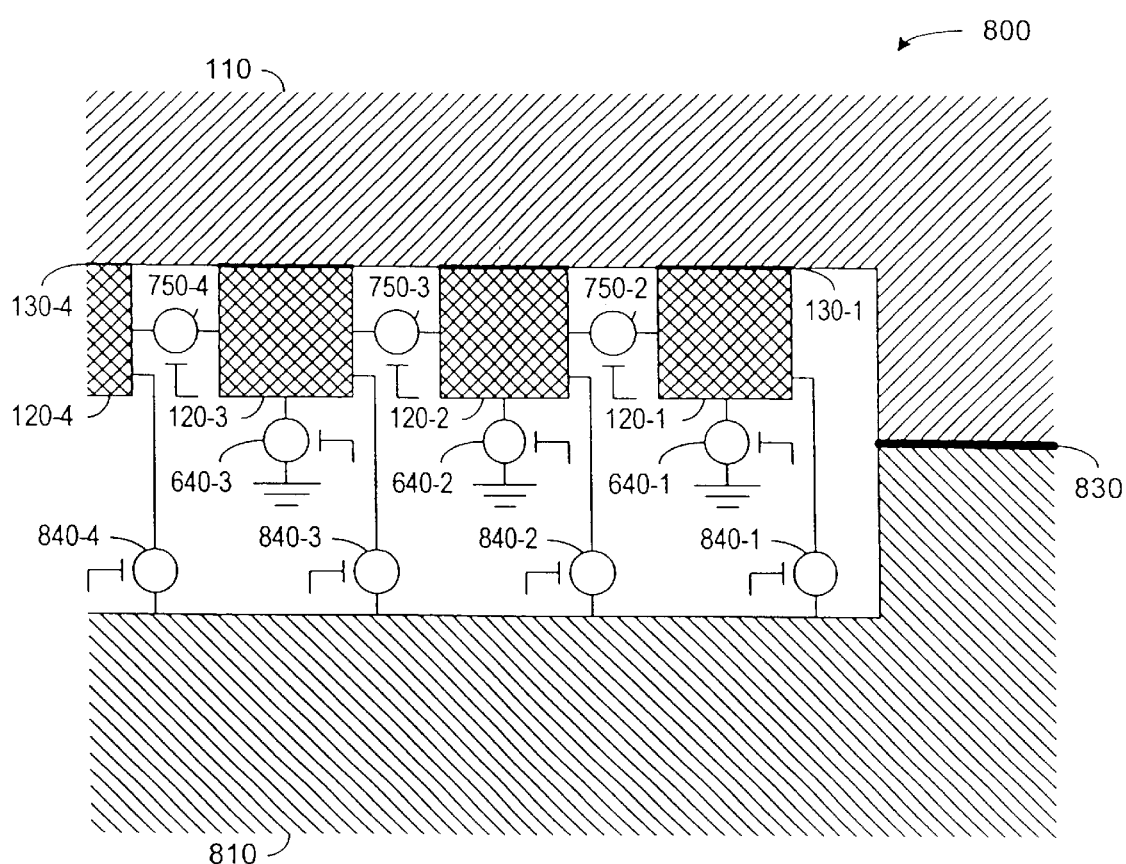
FIG. 8 illustrates a system having a double bus capable of applying different phases of the order parameter from the buses to the qubit.

FIG. 8 illustrates a quantum register 800 having a double bus configuration. Quantum register 800 includes a first superconducting bank 110 and a second superconducting bank 810 with a Josephson junction 830 between the banks. Josephson junction 830 creates a phase difference $\Delta\psi$ between the order parameter in bank 110 and the order parameter in bank 810. Josephson junction 830 is preferably a clean Josephson junction so that phase difference $\Delta\psi$ depends on the relative crystal orientations of banks 110 and 810, but junction 830 is alternatively an insulative or dirty Josephson junction. Superconducting islands 120-1 to 120-N connect to bank 110 via respective clean Josephson junctions 130-1 to 130-N.

Quantum register 800 includes three sets of SETs. SETs 640-1 to 640-N connect to respective islands 120-1 to 120-N to ground. SETs 750-2 to 750-N connect adjacent islands for controlled entanglements. SETs 840-1 to 840-N are between respective islands 120-1 to 120-N and bank 810. An advantage of quantum register 800 is the ability to change the initialization and ground-state tunneling probabilities by selecting which, if any, of SETs 840-1 to 840-N connect corresponding islands 120-1 to 120-N to bank 810.

To illustrate an initialization process using double-bus quantum register 800, let the phase of the superconducting order parameter in bus 110 be zero. The relative phase $\chi$ of bus 810 can be created by connecting bus 110 and 810 on the left of FIG. 8 and passing an external magnetic field through the left most portion of the resulting loop. Opening selected keys 840-1 to 840-N (while keys 640-1 to 640-N remain closed) creates an energy difference between the two previously degenerate ground states in the corresponding islands 120-1 to 120-N. In particular, the states with phases $+\Delta\phi$ and $-\Delta\phi$ when connected to bus 810 differ in energy with the energy difference being proportional to $[\cos(\Delta\phi+\chi)-\cos(\Delta\phi-\chi)]$. The connected islands 120-1 to 120-N eventually settle to the lowest energy state $+\Delta\phi$ or $-\Delta\phi$ depending on the phase $\chi$ of bus 810.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A quantum computing structure comprising:
    a bank of a superconducting material;
    a mesoscopic island of a superconducting material, wherein one of the mesoscopic island and the bank comprises a d-wave superconducting material and the other of the bank and the mesoscopic island comprises an s-wave superconducting material; and
    a Josephson junction between the mesoscopic island and the bank to form the quantum computing structure.

2. The structure of claim 1, further comprising a single electron transistor connected between the mesoscopic island and ground.

3. The structure of claim 1, wherein the mesoscopic island comprises the d-wave superconducting material, and the bank comprises the s-wave superconducting material.

4. The structure of claim 1, wherein the bank comprises a d-wave superconducting material, and the mesoscopic island comprises the s-wave superconducting material.

5. The structure of claim 1, further comprising:
    a second bank of superconducting material; and
    a Josephson junction between the first-mentioned bank and the second bank.

6. The structure of claim 5, further comprising a single electron transistor coupled between the second bank and the mesoscopic island.

7. The structure of claim 1, further comprising a substrate, wherein at least a portion of the bank is formed on the substrate, and the mesoscopic island is on the substrate and laterally adjacent to the portion of the bank on the substrate.

8. The structure of claim 7, wherein the mesoscopic island has a side surface adjacent to the bank that is perpendicular to the substrate.

9. The structure of claim 8, further comprising:
    a normal conductor between the top surface of the mesoscopic island and the bank; and
    an insulator on the substrate between the bank and the side surface of the island.

10. The structure of claim 7, wherein the island has a side surface adjacent to the mesoscopic bank that is at a non-zero angle with a normal to the substrate.

11. The structure of claim 10, wherein a second portion of the bank extends over a top surface of the mesoscopic island.

12. The structure of claim 11, further comprising a normal conductor between the top surface of the mesoscopic island and the bank and between the side surface of the mesoscopic island and the bank.

13. The structure of claim 1, wherein the Josephson junction comprises a layer of normal conductive material between the bank and the mesoscopic island.

14. The structure of claim 13, further comprising a substrate, wherein:
    the bank is formed on a top surface of the substrate;

the normal conductive material is a layer on the bank; and
the mesoscopic island is on the layer.

15. A quantum register comprising:

a bank of a first superconducting material;

a plurality of mesoscopic islands of a second superconducting material; and a plurality of Josephson junctions, each Josephson junction being between the bank and a corresponding one of the mesoscopic islands to form a quantum computing structure, wherein one of the first and second superconducting materials is a d-wave superconductor and another of the first and second superconducting materials is an s-wave superconductor.

16. The quantum register of claim 15, wherein the first superconducting material is the d-wave superconductor.

17. The quantum register of claim 15, wherein the second superconducting material is the d-wave superconductor.

18. The quantum register of claim 15, further comprising a plurality of single electron transistors, each single electron transistor being between ground and a corresponding one of the mesoscopic islands.

19. The quantum register of claim 15, further comprising a first plurality of single electron transistors, each single electron transistor in the first plurality being between mesoscopic islands in a corresponding pair of the mesoscopic islands.

20. The quantum register of claim 19, further comprising a second plurality of single electron transistors, each single electron transistor in the second plurality being between ground and a corresponding one of the plurality of mesoscopic islands.

21. The quantum register of claim 15, further comprising:

a second bank of superconducting material; and a Josephson junction between the first and second banks.

22. The quantum register of claim 21, further comprising a first plurality of single electron transistors, each single electron transistor being coupled between the second bank and a corresponding one of the mesoscopic islands.

23. The quantum register of claim 22, further comprising a second plurality of single electron transistors, each single electron transistor in the second plurality being between ground and a corresponding one of the mesoscopic islands.

24. The quantum register of claim 22, further comprising a second plurality of single electron transistors, each single electron transistor in the second plurality being between islands in a corresponding pair of the mesoscopic islands.

25. The quantum register of claim 24, further comprising a third plurality of single electron transistors, each single electron transistor in the third plurality being between ground and a corresponding one of the plurality of mesoscopic islands.

* * * * *